(12) United States Patent
Erickson et al.

(10) Patent No.: US 7,714,581 B2
(45) Date of Patent: May 11, 2010

(54) RF COIL ASSEMBLY FOR MAGNETIC RESONANCE IMAGING AND SPECTROSCOPY SYSTEMS

(75) Inventors: Matthew G. Erickson, Madison, WI (US); Sean B. Fain, Madison, WI (US); Krishna N. Kurpad, Madison, WI (US); James H. Holmes, Madison, WI (US); Thomas M. Grist, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 391 days.

(21) Appl. No.: 11/726,643

(22) Filed: Mar. 22, 2007

(65) Prior Publication Data
US 2007/0279061 A1 Dec. 6, 2007

Related U.S. Application Data

(60) Provisional application No. 60/793,283, filed on Apr. 19, 2006.

(51) Int. Cl.
*G01V 3/00* (2006.01)
(52) U.S. Cl. .................... 324/322; 324/318
(58) Field of Classification Search ......... 324/300–322; 600/407–435; 333/219–235
See application file for complete search history.

(56) References Cited

U.S. PATENT DOCUMENTS

| | | | |
|---|---|---|---|
| 2,999,204 A * | 9/1961 | Jones et al. | ............ 324/303 |
| 3,242,424 A * | 3/1966 | Redfield | .............. 324/310 |
| 4,680,548 A | 7/1987 | Edelstein et al. | |
| 4,686,473 A | 8/1987 | Chesneau et al. | |
| 4,692,705 A | 9/1987 | Hayes | |
| 4,694,255 A | 9/1987 | Hayes | |
| 4,746,866 A | 5/1988 | Roschmann | |
| 4,751,464 A | 6/1988 | Bridges | |
| 4,755,756 A | 7/1988 | Nishihara et al. | |
| 4,799,016 A | 1/1989 | Rezvani | |
| 4,859,950 A | 8/1989 | Keren | |
| 4,885,539 A | 12/1989 | Roemer et al. | |

(Continued)

FOREIGN PATENT DOCUMENTS

EP 0239147 A1 9/1987

(Continued)

OTHER PUBLICATIONS

Bogdanov, G.; Brevard, M.; Ferris, C.; Ludwig, R.; A Microstrip Resonator Volume Coil Optimized for Full-Body Rat Imaging at 9.4T; Proc. Intl. Soc. Mag. Reson. Med 13 (2005), p. 945.

*Primary Examiner*—Brij B. Shrivastav
*Assistant Examiner*—Tiffany A Fetzner
(74) *Attorney, Agent, or Firm*—Quarles & Brady LLP

(57) ABSTRACT

An RF coil assembly for an MRI system includes a resonator formed by a cylindrical shield and pairs of opposing conductive legs disposed symmetrically around a central axis and extending the axial length of the shield. Drive circuitry for each pair of opposing conductive legs includes a current balun that maintains substantially equal and opposite currents in the two conductive legs. Terminal susceptance elements are used to maintain maximum currents and minimum voltage at the midpoints of the conductive legs. Multinuclear measurements can be made simultaneously at different Larmor frequencies.

29 Claims, 17 Drawing Sheets

U.S. PATENT DOCUMENTS

| | | | |
|---|---|---|---|
| 4,887,039 A | 12/1989 | Roemer et al. | |
| 4,922,204 A | 5/1990 | Duerr et al. | |
| 4,952,879 A | 8/1990 | Van Vaals et al. | |
| 5,296,814 A | 3/1994 | Lyle | |
| 5,402,785 A | 4/1995 | Leigh et al. | |
| 5,557,247 A | 9/1996 | Vaughn, Jr. | |
| 5,680,046 A | 10/1997 | Frederick et al. | |
| 5,990,681 A | 11/1999 | Richard et al. | |
| 6,236,206 B1 | 5/2001 | Hartman et al. | |
| 6,313,631 B1 | 11/2001 | Fiat et al. | |
| 6,320,385 B1 | 11/2001 | Burl et al. | |
| 6,344,745 B1 | 2/2002 | Reisker et al. | |
| 6,377,044 B1 | 4/2002 | Burl et al. | |
| 6,396,271 B1 | 5/2002 | Burl et al. | |
| 6,538,441 B1 | 3/2003 | Watkins et al. | |
| 6,559,642 B2 | 5/2003 | King | |
| 6,590,392 B2 | 7/2003 | Boskamp et al. | |
| 6,593,144 B2 | 7/2003 | Albert et al. | |
| 6,593,743 B2 | 7/2003 | de Swiet et al. | |
| 6,618,610 B2 | 9/2003 | Nabetani | |
| 6,822,448 B2 | 11/2004 | Watkins et al. | |
| 6,906,518 B2 | 6/2005 | Leussler | |
| 6,915,151 B2 | 7/2005 | Baumgardner et al. | |
| 7,019,527 B2 | 3/2006 | Kleihorst et al. | |
| 7,446,528 B2 * | 11/2008 | Doddrell et al. | 324/318 |
| 7,508,212 B2 * | 3/2009 | Fain et al. | 324/318 |
| 2003/0184293 A1 | 10/2003 | Boskamp et al. | |
| 2005/0242816 A1 | 11/2005 | Kurpad et al. | |
| 2006/0012370 A1 | 1/2006 | Barberi | |
| 2007/0279061 A1 * | 12/2007 | Erickson et al. | 324/322 |
| 2008/0129292 A1 * | 6/2008 | Leussler et al. | 324/318 |
| 2008/0231281 A1 * | 9/2008 | Fain et al. | 324/322 |

FOREIGN PATENT DOCUMENTS

EP 0454370 A2 10/1991

* cited by examiner

RF COIL ASSEMBLY FOR MAGNETIC RESONANCE IMAGING AND SPECTROSCOPY SYSTEMS

CROSS REFERENCE TO RELATED APPLICATIONS

This application claims the benefit of U.S. Provisional Patent Application Ser. No. 60/793,283, filed Apr. 19, 2006, and titled "RF Coil for Magnetic Resonance Imaging and Spectroscopy Systems", which is hereby incorporated by reference.

STATEMENT REGARDING FEDERALLY FUNDED RESEARCH

This invention was made with United States government support awarded by the following agency: NIH grants: HL069116 and HL066488. The United States has certain rights in this invention.

FIELD OF THE INVENTION

The field of the invention is nuclear magnetic resonance imaging (MRI) methods and systems. More particularly, the invention relates to coils used to apply radio frequency (RF) magnetic fields to the subject being examined and coils used to receive NMR signals produced in response.

BACKGROUND OF THE INVENTION

When a substance such as human tissue is subjected to a uniform magnetic field (polarizing field $B_0$) applied along the z axis of a Cartesian coordinate system, the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, Mz, may be rotated, or "tipped", into the x-y plane to produce a net transverse magnetic moment $M_t$. A NMR signal is emitted by the excited spins after the excitation signal $B_1$ is terminated, this signal may be received and processed to form an image or produce a spectrum.

When utilizing these signals to produce images, magnetic field gradients ($G_x$, $G_y$ and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

Radio frequency antennas, or coils are used to produce the excitation field $B_1$ and other RF magnetic fields in the subject being examined. Such coils are also used to receive the very weak NMR signals that are produced in the subject. Such coils may be so-called "whole body" coils that are large enough to produce a uniform magnetic field for a human subject or, they can be much smaller "local" coils that are designed for specific clinical applications such as head imaging, knee imaging, wrist imaging, etc. Local coils may be either volume coils or surface coils.

The most common whole body coil found in commercial MRI systems is the so-called "birdcage" coil first disclosed in U.S. Pat. Nos. 4,692,705; 4,694,255; and 4,680,548. A birdcage coil has a pair of circular end rings which are bridged by a plurality (typically 8 to 24) of equi-spaced longitudinal straight segments. In a primary mode, currents in the straight segments are sinusoidally distributed which results in good $B_1$ field uniformity across the axis of the coil. Birdcage coils are the structure of choice in horizontal field MRI systems because they produce a homogeneous magnetic $B_1$ field in the bore of the magnet. When properly designed and constructed, they have a high SNR which enables them to pick up the small NMR signals emanating from the subject under examination.

The birdcage coil is tuned by proper selection of capacitors which are distributed along the lengths of the straight segments, distributed around each end ring or both. Matching and tuning are commonly achieved by connecting variable capacitors in an "L" configuration at the drive ports. Birdcage coils are typically driven at one, two, or more recently, four ports. Multi-port drive, where each drive source is appropriately phased, ensures uniform, circularly polarized $B_1$ fields in the imaging volume at $B_0$ field strengths of 1.5 T or less. Efforts to improve the tunability of birdcage coils either provide fewer capacitor adjustments that distort the homogeneity of the B1 field or provide expensive and complex tuning structures such as those described in U.S. Pat. Nos. 6,396,271 and 6,236,206.

High field MRI, with $B_0$ field strength of 3 T or higher, is rapidly winning acceptance in both clinical and research programs. High field MRI offers many benefits, while simultaneously presenting many research and design problems. The main benefit of high field MRI is increased signal to noise ratio (SNR). SNR increases linearly with static field strength. This increase provides significant advantages in terms of spatial, temporal, and spectral resolution. Functional MRI (fMRI) is an application of MRI that is used to analyze brain function using blood oxygenation level dependent (BOLD) contrast to detect the brain's response to a specific stimulus. For accurate analysis, fMRI demands both high spatial and high temporal imaging resolution. Several studies have demonstrated the benefit of high static field strength for fMRI applications. Proton MR Spectroscopy (MRS) is used for metabolic characterization of tumors, and for monitoring treatment of epilepsy, stroke, infections, and multiple sclerosis, though this list is by no means exhaustive. Since a higher static magnetic field provides a greater absolute chemical shift, the resolution of metabolite peaks improves, leading to greater accuracy in the identification and quantification of metabolites. These benefits also apply to imaging and spectroscopy with carbon-13, whether thermal or hyperpolarized. MR microscopy is used for imaging at sub-millimeter resolution. This technique also benefits from a higher $B_0$.

The main problem with high field imaging is $B_1$ (RF) field inhomogeneity induced by the sample under examination. The dielectric properties of the sample are largely responsible for these effects. This phenomenon may be seen in a high dielectric phantom imaged at high field; a characteristic bright spot is seen, surrounded by dark bands. Human tissues generally have a relative permittivity ranging between 50 and 80 at 128 MHz (3 T field, proton frequency). This is compounded by the fact that the human body is inhomogeneous, unlike a typical MRI phantom. Thus, the wavelength of RF in the body at 128 MHz ranges from around 26 cm to 34 cm. These wavelengths are comparable to the dimensions of the human body; hence phase shifts occur in the body. Due to the multiple sources of $B_1$ field in a coil (multiple conductors), these phase shifts result in interference patterns inside the body. These patterns manifest themselves on MR images. As one increases the static magnetic field above and beyond 3 T, this problem worsens. One solution to this problem is to "pre-distort" the RF $B_1$ field in such a way as to compensate for the effects of an inhomogeneous dielectric. It is therefore desirable to design RF coils with provision for phase and amplitude control for each conductive element.

The sample under examination has conductive properties along with the dielectric properties mentioned above. As a result, stray or "parasitic" capacitance is created between the load and the conductive elements of the RF coil. For coils designed to operate at static fields of 1.5 T and below, the lumped capacitive elements used to resonate the coil at the desired Larmor frequency are fairly large compared to the stray capacitances introduced by the specimen or load. At higher $B_0$ fields, parasitic capacitances become comparable in size to coil component capacitors. It follows that an asymmetric load placed in the coil would lead to unequal frequency shifts in the resonant loops of the coil, thereby perturbing the ideal sinusoidal current distribution and eliminating the desired "neutral point" in the center of the coil, leading to poor $B_1$ field homogeneity. In addition, local E field "hot spots" may occur, which may cause excessive RF heating above the specific limits on specific absorption rates (SAR) for human tissue set by the FDA. This problem can be ameliorated somewhat by using coils designed around transmission line elements, which have capacitance distributed along their length, in contrast with the lumped capacitance elements used in the birdcage coil designs.

Examples of distributed capacitance coils include the original transverse electromagnetic (TEM) resonator described by Roschmann in U.S. Pat. No. 4,746,866, and the TEM volume resonator described by Vaughan in U.S. Pat. No. 5,557,247. In U.S. Pat. No. 5,557,247, an array of transmission line elements with adjustable, re-entrant center conductor elements are arranged on a circular perimeter so as to form a multi-mode resonant cavity structure. In practice, the device is tuned and matched such that a specific mode coincides with the Larmor frequency. Circular polarized versions of this coil are driven at two ports 90 degrees out of phase with one another, with the remaining conductive elements couple to one another by induction. The phase increment between adjacent elements is N/360 degrees, where N is the number of elements. For proper operation of the coil, all elements must be of the same impedance. In practice, it is often necessary to adjust the re-entrant center conductors of each element in order to achieve this condition.

There are a number of clinical applications where MR images are acquired at different Larmor frequencies. Hydrogen ($H^1$) is the spin species of choice for most MR imaging applications, but other paramagnetic spin species such as phosphorus ($^{31}P$), fluorine ($^{19}F$), carbon ($^{13}C$), sodium ($^{23}Na$), helium ($^3He$) and xenon ($^{129}Xe$) are also employed. Most of these alternative spin species are of interest in MR spectroscopy, but the use of helium for imaging the lung, for example, has significant clinical potential. As indicated above, the birdcage coil is difficult to tune at more than one Larmor frequency and the substantial change in Larmor frequency required to examine these alternative spin species is not practical.

Multinuclear excitation and reception coils have been proposed. In U.S. Pat. No. 4,799,016 for example, two birdcage coils are formed on one cylindrical substrate, with one coil tuned to hydrogen ($^1H$) and the other tuned to phosphorus ($^{13}P$). To reduce interaction between the coils, the fields they produce are offset 90° in phase. In U.S. Pat. No. 5,990,681 an RF coil is described which has an adjustment end ring provided on the end of a birdcage coil, wherein the ring can be rotated to change its Larmor frequency. An important limitation of prior multinuclear coils is that they consist of multi-modal resonant structures such as birdcage or TEM volume resonators. If one of the resonant modes corresponding to the Larmor frequency of the first nucleus coincides with the fundamental resonant mode corresponding to the Larmor frequency of the second nucleus, the isolation between the two components of the multi-nuclear coil degrades, and the two components of the coil cannot be operated simultaneously. In addition, poor isolation tends to degrade efficiency for each component of the coil in question. In practice, this means that when an image of a subject is acquired at the Larmor frequency of one nucleus, a subsequent scan must be performed if an image is to be obtained at the Larmor frequency of the second nucleus. During the time interval between scans, subject motion may occur, making the co-registration of the two scans difficult. It is therefore desirable to design multi-nuclear coils wherein the component coils are not multi-modal in nature, and the component coils have good electrical isolation and nearly identical spatial profiles.

SUMMARY OF THE INVENTION

The present invention is a TEM coil with drive circuitry which may be used as a whole body RF coil on an MRI system or used as a local coil with an MRI system to transmit a uniform $B_1$ magnetic field or receive NMR signals. Unlike the TEM volume resonator described by Vaughan in U.S. Pat. No. 5,557,247, the TEM coil or resonator of the present invention is more of a "pure" TEM device in that the utility volume itself is not a resonant structure, and multiport excitation via a plurality of phased current baluns (as described below) suppresses unwanted modes, such that only excitation equivalent to the M=1 mode described in the Vaughan patent is possible.

The present invention is a coil assembly for an MRI system that includes a coil or resonator having a cylindrical or Faraday shield that encircles a central axis and supports a plurality of pairs of opposing conductive legs or rods arranged symmetrically around the central axis and extending between the ends of the shield parallel to the central axis. Terminal susceptance elements (or reactance elements), in the form of capacitors, fixed or variable, can be shunted across the end of each conductive leg to the Faraday shield. The terminal susceptance elements can also take the form of open circuit or short circuit transmission line stubs terminating the conductive legs. The susceptance jB of either the capacitors or the stubs is chosen such that a current maximum and a voltage minimum (i.e, a "virtual short") is established at the midpoint of each conductive leg at the desired Larmor frequency. The conductive legs are connected to drive circuits that establish equal but opposite current flows in each of the pairs of opposing conductive legs.

Another aspect of the invention is the use of a current balun connected to each pair of opposing conductive legs which is operable to maintain equal currents in each conductive leg. In MRI work, proper current distribution on RF coil elements is of paramount importance if a homogeneous $B_1$ field is to be realized.

Another aspect of the present invention is a tune and match circuit connected between the conductive legs and the current balun to match the impedances thereof. In one embodiment, the tune and match circuit is a simple transmission line matching stub of appropriate susceptance jB, placed at a point where the 2.0 normalized conductance circle is intersected on an admittance Smith Chart. In one embodiment, this matching stub can be a short circuit variable length stub with provision for translation of the stub along the balanced line a few centimeters in each direction. The matching stub would be placed at a match point where capacitive susceptance would be canceled. This point would be very close to the match point where inductive susceptance would be canceled as the Q is so high. The length of such a stub would be only a few centimeters long at 128 MHz.

In other embodiments, the tune and match circuit includes a capacitive L network at the input (generator side port) of each conductive element, or preferably, a butterfly variable capacitor placed across the balance line feeding each conductive pair at a point where the unit conductance circle is intersected on an admittance Smith Chart, thereby permitting cancellation of inductive susceptance by the butterfly capacitor. In this latter embodiment, provision can be made for the butterfly capacitor to freely translate a few centimeters in either the generator or load direction while maintaining good electrical contact with the elements of the balanced transmission line.

Another aspect of the invention is a coil assembly that can operate at multiple Larmor frequencies simultaneously. This multi-nuclear capability is possible by providing multiple resonators having separate pairs of conductive legs within the same cylindrical shield and enclosing the same imaging volume. Separate drive circuits are provided for the separate pairs of conductive legs that are operated at different Larmor frequencies. The terminal susceptance elements associated with a pair of conductive legs are optimized for the Larmor frequency of one nucleus while also effecting a voltage anti-node, or high impedance at the Larmor frequency of the other nucleus. Thus, in selected cases of dual nuclear capability, the two channels can be well isolated from each other.

The current baluns, tune and match circuits, and terminal susceptance elements are located at points external to the cylindrical shield such that no capacitors, inductors, or other elements need be located within the cylindrical shield. Further, the dimensions of the resonator can be selected without regard for frequency of operation, provided that its length does not exceed a critical fraction of the Larmor frequency wavelength $\lambda$.

The coil assembly is well suited for operation at high polarizing magnetic field strengths ($B_0$), e.g. 3 T or above, with easy portability between different magnetic field strengths. The coil assembly can be easily and inexpensively constructed, is easy to tune, and provides good B1 field homogeneity, good stability with varying loads, high transmit efficiency, and a high receive signal to noise ratio (SNR).

DESCRIPTION OF THE PREFERRED EMBODIMENT

Figure 1:
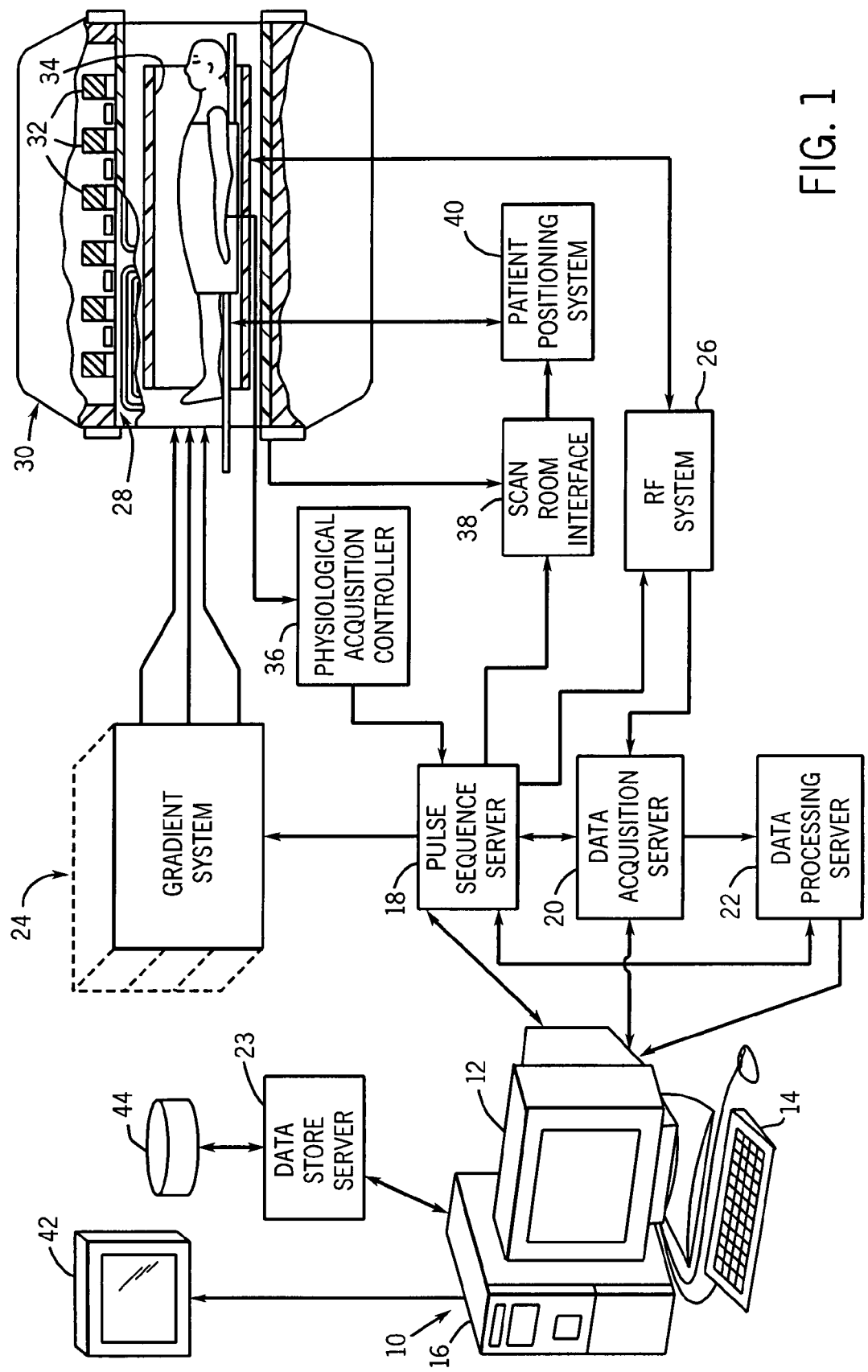
FIG. 1 is a block diagram of an MRI system which employs the present invention.

Referring particularly to FIG. 1, the preferred embodiment of the invention is employed in an MRI system. The MRI system includes a workstation 10 having a display 12 and a keyboard 14. The workstation 10 includes a processor 16 which is a commercially available programmable machine running a commercially available operating system. The workstation 10 provides the operator interface which enables scan prescriptions to be entered into the MRI system.

The workstation 10 is coupled to four servers: a pulse sequence server 18; a data acquisition server 20; a data processing server 22, and a data store server 23. In the preferred embodiment the data store server 23 is performed by the workstation processor 16 and associated disc drive interface circuitry. The remaining three servers 18, 20 and 22 are performed by separate processors mounted in a single enclosure and interconnected using a 64-bit backplane bus. The pulse sequence server 18 employs a commercially available microprocessor and a commercially available quad communication controller. The data acquisition server 20 and data processing server 22 both employ the same commercially available microprocessor and the data processing server 22 further includes one or more array processors based on commercially available parallel vector processors.

The workstation 10 and each processor for the servers 18, 20 and 22 are connected to a serial communications network. This serial network conveys data that is downloaded to the servers 18, 20 and 22 from the workstation 10 and it conveys tag data that is communicated between the servers and between the workstation and the servers. In addition, a high speed data link is provided between the data processing server 22 and the workstation 10 in order to convey image data to the data store server 23.

The pulse sequence server 18 functions in response to program elements downloaded from the workstation 10 to operate a gradient system 24 and an RF system 26. Gradient waveforms necessary to perform the prescribed scan are produced and applied to the gradient system 24 which excites gradient coils in an assembly 28 to produce the magnetic field gradients $G_x$, $G_y$ and $G_z$ used for position encoding NMR signals. The gradient coil assembly 28 forms part of a magnet assembly 30 which includes a polarizing magnet 32 and a whole-body RF coil 34 made in accordance with the teachings of the present invention.

RF excitation waveforms are applied to the RF coil 34 by the RF system 26 to perform the prescribed magnetic resonance pulse sequence. Responsive NMR signals detected by the RF coil 34 are received by the RF system 26, amplified, demodulated, filtered and digitized under direction of commands produced by the pulse sequence server 18. The RF system 26 includes an RF transmitter for producing a wide variety of RF pulses used in MR pulse sequences. The RF transmitter is responsive to the scan prescription and direction from the pulse sequence server 18 to produce RF pulses of the desired frequency, phase and pulse amplitude waveform. The generated RF pulses may be applied to the whole body RF coil 34 or to one or more local coils or coil arrays.

The RF system 26 also includes one or more RF receiver channels. Each RF receiver channel includes an RF amplifier that amplifies the NMR signal received by the RF coil to which it is connected and a quadrature detector which detects and digitizes the I and Q quadrature components of the received NMR signal. The magnitude of the received NMR signal may thus be determined at any sampled point by the square root of the sum of the squares of the I and Q components:

$$M=\sqrt{I^2+Q^2},$$

and the phase of the received NMR signal may also be determined:

$$\phi=\tan^{-1}Q/I.$$

The pulse sequence server 18 also optionally receives patient data from a physiological acquisition controller 36. The controller 36 receives signals from a number of different sensors connected to the patient, such as ECG signals from electrodes or respiratory signals from a bellows. Such signals are typically used by the pulse sequence server 18 to synchronize, or "gate", the performance of the scan with the subject's respiration or heart beat.

The pulse sequence server 18 also connects to a scan room interface circuit 38 which receives signals from various sensors associated with the condition of the patient and the magnet system. It is also through the scan room interface circuit 38 that a patient positioning system 40 receives commands to move the patient to desired positions during the scan.

It should be apparent that the pulse sequence server 18 performs real-time control of MRI system elements during a scan. As a result, it is necessary that its hardware elements be operated with program instructions that are executed in a timely manner by run-time programs. The description components for a scan prescription are downloaded from the workstation 10 in the form of objects. The pulse sequence server 18 contains programs which receive these objects and converts them to objects that are employed by the run-time programs.

The digitized NMR signal samples produced by the RF system 26 are received by the data acquisition server 20. The data acquisition server 20 operates in response to description components downloaded from the workstation 10 to receive the real-time NMR data and provide buffer storage such that no data is lost by data overrun. In some scans the data acquisition server 20 does little more than pass the acquired NMR data to the data processor server 22. However, in scans which require information derived from acquired NMR data to control the further performance of the scan, the data acquisition server 20 is programmed to produce such information and convey it to the pulse sequence server 18. For example, during prescans NMR data is acquired and used to calibrate the pulse sequence performed by the pulse sequence server 18. Also, navigator signals may be acquired during a scan and used to adjust RF or gradient system operating parameters or to control the view order in which k-space is sampled. And, the data acquisition server 20 may be employed to process NMR signals used to detect the arrival of contrast agent in an MRA scan. In all these examples the data acquisition server 20 acquires NMR data and processes it in real-time to produce information which is used to control the scan.

The data processing server 22 receives NMR data from the data acquisition server 20 and processes it in accordance with description components downloaded from the workstation 10. Such processing may include, for example: Fourier transformation of raw k-space NMR data to produce two or three-dimensional images; the application of filters to a reconstructed image; the performance of a backprojection image reconstruction of acquired NMR data; the calculation of functional MR images; the calculation of motion or flow images, etc.

Images reconstructed by the data processing server 22 are conveyed back to the workstation 10 where they are stored. Real-time images are stored in a data base memory cache (not shown) from which they may be output to operator display 12 or a display 42 which is located near the magnet assembly 30 for use by attending physicians. Batch mode images or selected real time images are stored in a host database on disc storage 44. When such images have been reconstructed and transferred to storage, the data processing server 22 notifies the data store server 23 on the workstation 10. The workstation 10 may be used by an operator to archive the images, produce films, or send the images via a network to other facilities.

Figure 2:
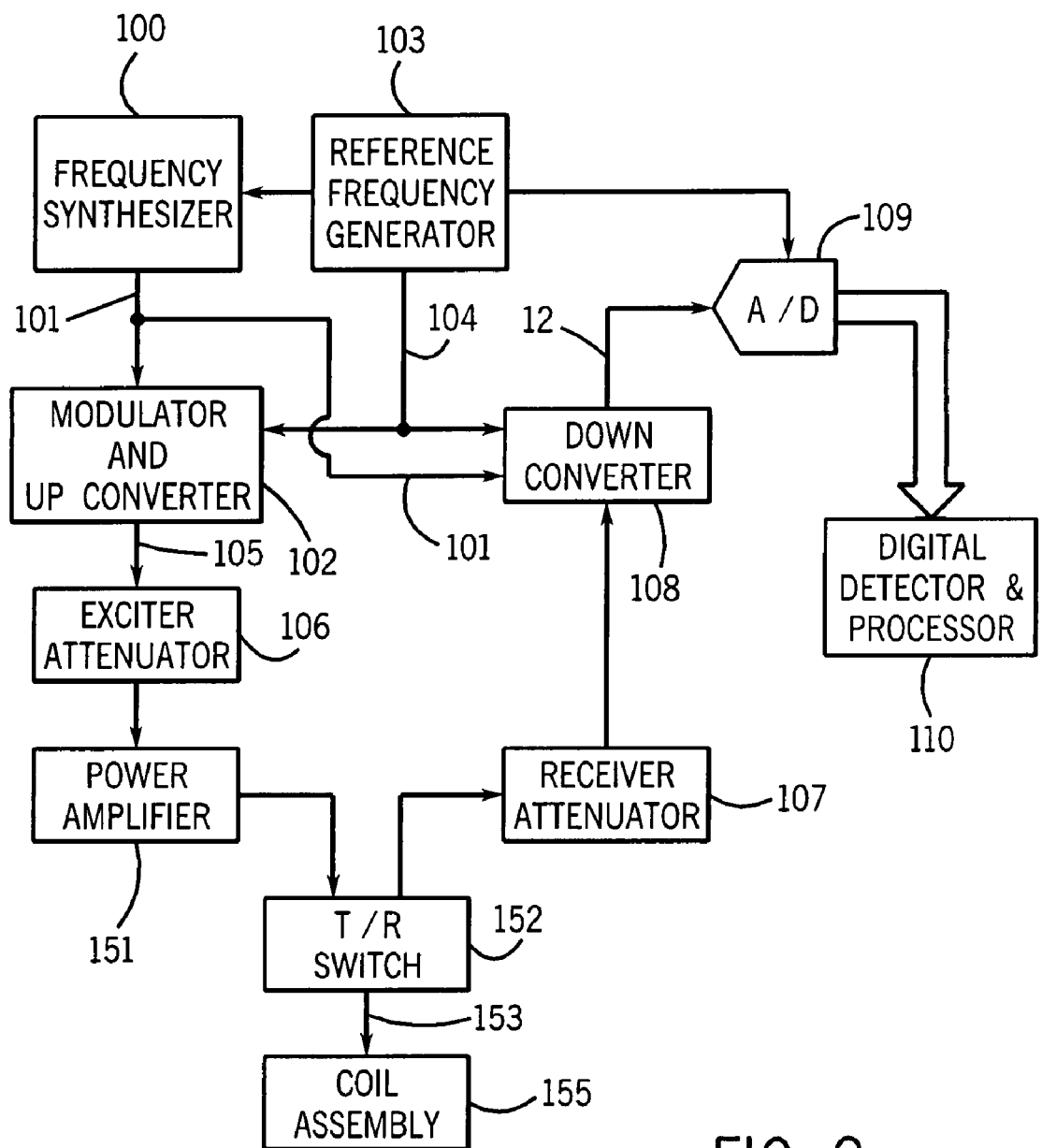
FIG. 2 is a block diagram of the RF system that forms part of the MRI system of FIG. 1.

Referring particularly to FIG. 2, the RF system 26 include a single transmitter which produces a prescribed RF excitation field. In other embodiments, RF system 26 can include multiple transmitters. The base, or carrier, frequency of an RF excitation field is produced under control of a frequency synthesizer 100 which receives a set of digital signals from the pulse sequence server 18. These digital signals indicate the frequency and phase of the RF carrier signal produced at an output 101. The RF carrier signal is applied to a modulator and up converter 102 where its amplitude is modulated in response to a signal R(t) also received from the pulse sequence server 18. The signal R(t) defines the envelope of the RF excitation pulse to be produced and is produced by sequentially reading out a series of stored digital values. These stored digital values may be changed to enable any desired RF pulse envelope to be produced.

The magnitude of the RF excitation pulse produced at output 105 is attenuated by an exciter attenuator circuit 106 which receives a digital command from the pulse sequence server 18. The attenuated RF excitation pulses are applied to the power amplifier 151 that drives the RF coil 34, in this case RF resonator 172 of coil assembly 155 (see FIG. 3), through a transmit/receive (T/R) switch 152. For a more detailed description of this transmitter section reference is made to U.S. Pat. No. 4,952,877 which is incorporated herein by reference.

Referring still to FIG. 2, the NMR signal produced by the subject is picked up by the RF resonator 172 of coil assembly 155 and applied through the transmit/receive switch 152 to a receiver channel. Although FIG. 2 illustrates a single receiver channel, in other embodiments, RF system 26 can include multiple receiver channels. The NMR signals are applied to a receiver preamplifier and attenuator 107 which amplifies the NMR signal by an amount determined by a digital attenuation signal received from the pulse sequence server 18. The received NMR signal is at or around the Larmor frequency, and this high frequency signal is down converted in a two step process by a down converter 108 which first mixes the NMR signal with the carrier signal on line 101 and then mixes the resulting difference signal with a reference signal on line 104. The down converted NMR signal is applied to the input of an analog-to-digital (A/D) converter 109 which samples and digitizes the analog signal and applies it to a digital detector and signal processor 110 which produces 16-bit in-phase (I) values and 16-bit quadrature (Q) values corresponding to the received signal. The resulting stream of digitized I and Q values of the received signal are output to the data acquisition server 20. The reference signal as well as the sampling signal applied to the A/D converter 109 are produced by a reference frequency generator 103. For a more detailed description of the receiver, reference is made to U.S. Pat. No. 4,992,736 which is incorporated herein by reference.

The transmit/receive switch 152 is used when the RF resonator 172 is employed to both produce the uniform $B_1$ field and receive the resulting NMR signals. It is operated by the pulse sequence server 18 to switch to the transmitter during parts of the pulse sequence in which RF fields are to be produced, and to switch connection to the receiver when NMR data is to be acquired. The connecting line 153 between the transmit/receive switch 152 and the coil assembly 155 is preferably a 50 ohm coaxial cable such as RG-213 Mil Spec or Andrews FSJ-50.

The RF resonator 172 may be used as a whole body RF coil or as a local coil, such as a head coil. Further, the RF resonator 172 and coil assembly 155 may be used in both the transmit and receive modes, or in the transmit or receive modes only. In the latter cases, the transmit/receive switch 152 is not needed and the transmit coil may be connected directly to the power amplifier 151 and the receive coil may be connected directly to the receiver attenuator 107.

Figure 3:
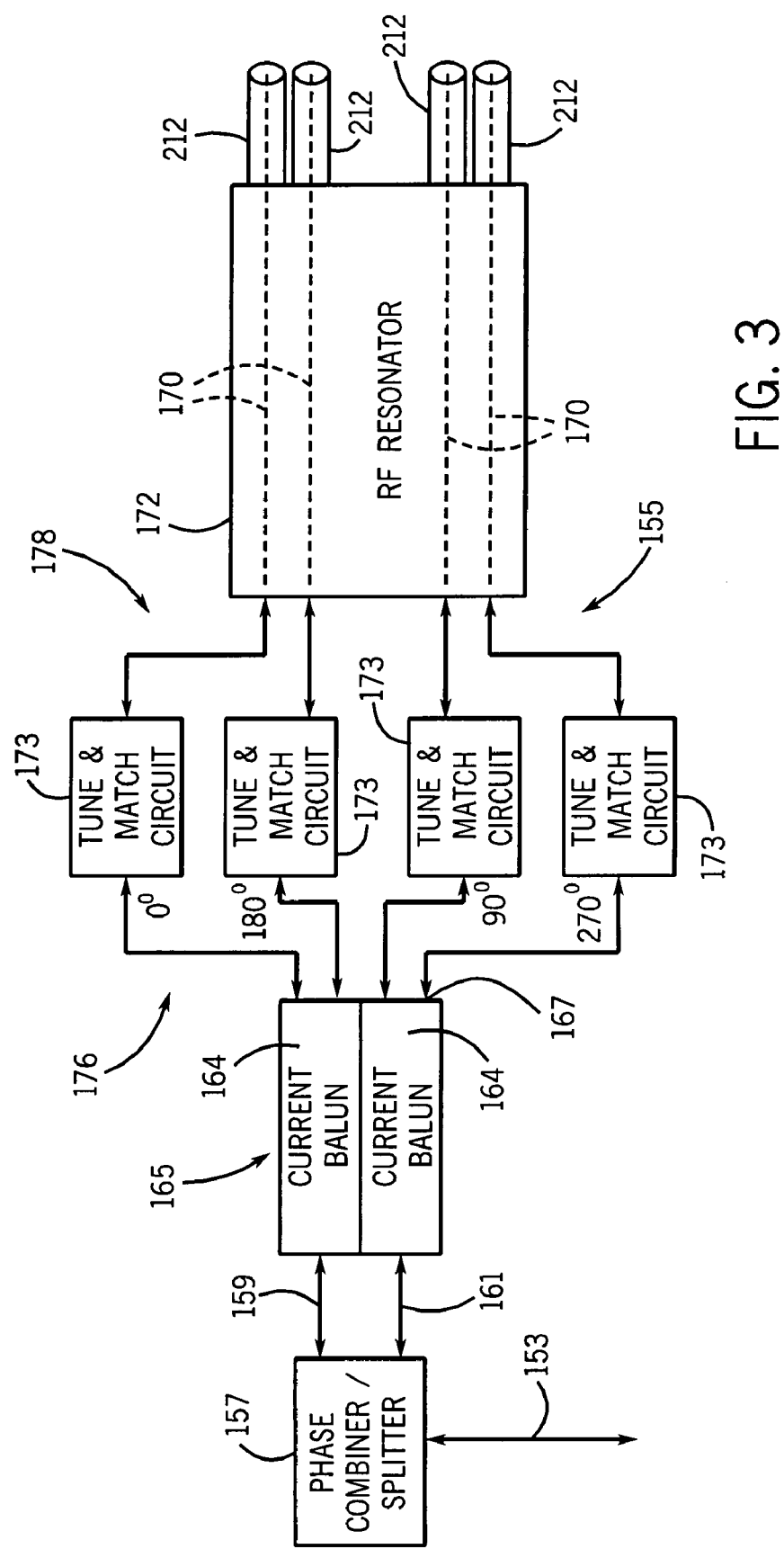
FIG. 3 is a block diagram of a first preferred embodiment of the coil assembly that forms part of FIG. 2.

The coil assembly 155 can take many specific forms, but one embodiment includes the elements shown in FIG. 3. These include a phase combiner/splitter 157, current balun pairs 165, tune and match circuits 173, an RF resonator or coil 172, and terminal susceptance elements such as coaxial termination stubs 212. The resonator 172 includes a plurality of conductive legs 170 within a cylindrical shield 200 (see FIG. 7). In brief, pairs of conductive legs 170 operate as balanced transmission lines terminated by terminal susceptance elements such as coaxial stubs 212 and standing waves are established on each conductive leg 170 within the cylindrical shield by proper selection of the terminal susceptance elements. Preferably, the resonator 172 operates with quadrature phasing on both transmit and receive which is provided by the circuit 157 and current balun pair 165.

The phase combiner/splitter 157 connects to the coaxial line 153 from the transceiver and produces two equal RF currents on preferably 50 ohm coaxial lines 159 and 161 which differ in phase by 90°. In its simplest form the phase combiner/splitter 157 is a 50 ohm T connector with the common connection made to line 153 and each of the T arms connected to one of the lines 159 or 161 through a matched transmission line. One of the transmission line sections is one quarter wavelength longer than the other section to impart a 90° phase difference between currents on lines 159 and 161. With this particular embodiment, the circuit 157 must be tuned to the particular Larmor frequency being employed. In the alternative, other circuits are well known in the art which can split an RF signal applied through line 153 to quadrature RF signals that are produced on lines 159 and 161, or which can combine quadrature signals applied through lines 159 and 161 into a single combined RF signal on line 153. Phase combiner/splitter circuits that can operate at many frequencies are described, for example, in U.S. Pat. Nos. 5,296,814 and 7,019,527 which are incorporated herein by reference.

In the embodiment illustrated in FIG. 3, a current balun pair 165 is provided with each balun individually driven by a respective quadrature signal on line 159 or line 161. While in most cases it is desirable that the quadrature signals on lines 159 and 161 be exactly 90° out of phase with each other, there are instances when adjustments away from exact quadrature are desirable. This can easily be achieved using different lengths of matched transmission line segments similar to the use of a 90° retardation line as mentioned above. The retardation line may be a variable length line by means of an inserted line stretcher, or an air dielectric adjustable coaxial line. Incorporation of this feature allows the operator to make fine adjustments of the polarizability ellipsoid of the RF field B1. In other words, the phasing may be set a few degrees plus or minus from phase quadrature. Local inhomogeneity in the RF B1 field can be a problem at high fixed fields (B0) because of anisotropy in the magnetic susceptibility tensor Chi; these local inhomogeneities can be corrected by adjusting the polarizability of RF magnetic field B1.

Additionally, various circuits are commercially available which are operable to provide the desired RF excitation field, produce phase quadrature output signals, and also allow programmable control of the amount of phase offset. For example, a chip from Analog Devices, namely its CMOS 300 MSPS Quadrature Complete DDS (direct digital synthesis) chip, provides this functionality, and would also replace many of the components of the RF system illustrated in FIG. 2. The DDS chip controls the phase and amplitude of the RF currents applied to the input of the current baluns. This embodiment would be especially useful for tailored RF excitation pulses. One popular scheme for tailored RF excitation is known as Transmit SENSE, although other transmitter based parallel imaging schemes are also possible. By controlling a plurality of tuned and matched conjugate pairs with a digital control system as described above, fine control of the $B_1$ field's three dimensional shape can be attained.

The I and Q quadrature RF signals on coaxial cable lines 159 and 161 are each coupled to a balanced load by a respective current balun 164 of current balun pair 165. As is well known in the art, a coaxial cable is an unbalanced feedline and currents can flow on the outer surface of its shield which cause an unbalanced current flow. As will be described below, the balanced load in this embodiment can be viewed as a ½ wave dipole and the purpose of each balun 164 is to insure that the current flow in one arm of the dipole is always substantially equal and opposite to the current flow in the contralateral dipole arm. A balun that fulfills this objective is a "current" balun and maintains the balanced currents in the dipole arms even though the impedances of the two dipole arms may be different. The current balun is important in this application because in MRI it is the current, not the voltage that produces the magnetic field and it is the magnetic field rather than the electric field that is important. Also, whereas the dipole can be constructed with symmetric loads on each dipole arm, in this case the dipole arms are part of a resonator structure described below that receives a subject to be examined. When placed in the resonator, the subject loading often becomes unequal on the two dipole arms. By using the current balun 164, current balance is maintained despite such asymmetric loading and the homogeneity of the RF magnetic field in the resonator is maintained.

A number of current balun circuits and devices are known in the art and can be used at MRI Larmor frequencies. One simple and effective balun is a choke or coil balun 164C, which can be constructed simply by coiling up an appropriate amount of coaxial cable (such as coaxial cable 159 and 161) such as is illustrated in FIG. 4(c). If the dimensions are correct, the inductive reactance of the coiled cable will effectively block the undesired current flowing on the outer surface of its shield. Air core choke baluns work well at the VHF frequencies (64 MHz and up) used in most MRI work. For example, a mere five turns of RG-213 cable wound as a solenoid on a 4 inch polyethylene cylinder will give adequate common mode current suppression for sodium-23 and carbon-13 in a 3 T MRI system.

Figure 4A:
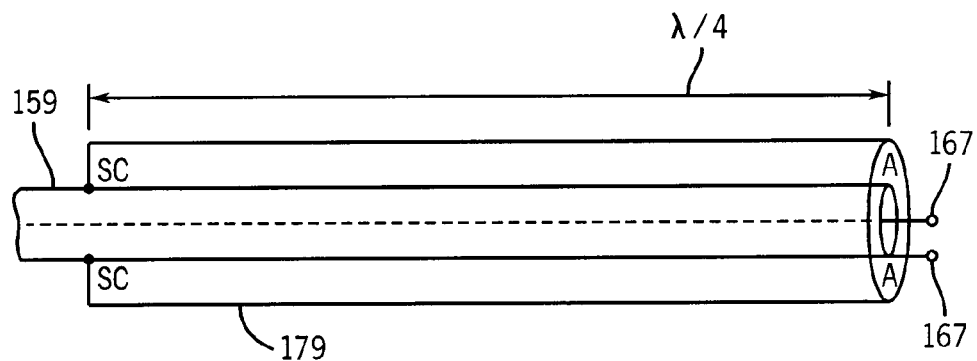
FIGS. 4(a)-(c) are pictorial representations of different types of current baluns that can form part of the coil assembly of FIG. 3.

Another type of current balun, a sleeve balun 164A, such as shown in FIG. 4(a), is also feasible. A conductive sleeve 179 is shorted to the outer conductor of the coaxial line 159 from the phase combiner/splitter 157 at points denoted by SC. In this drawing, the left hand side past the sleeve connection point SC is unbalanced and the right hand side is balanced at terminals 167. A sleeve balun works if it is ¼ wavelength in length, or an odd multiples thereof, such that the short circuit at point SC inverts at the point A on the outer shield and thus common mode current is suppressed. However, such a sleeve balun might not be feasible for sodium and carbon 13, which resonate near the 10 meter Amateur band even in a 3 T magnet. Since line losses are not poignant at these frequencies, another type of current balun that can be used for these nuclei is a ferrite bead balun which is located well out of the magnet. Such a ferrite bead balun 164B is shown in FIG. 4(b).

Figure 4B:
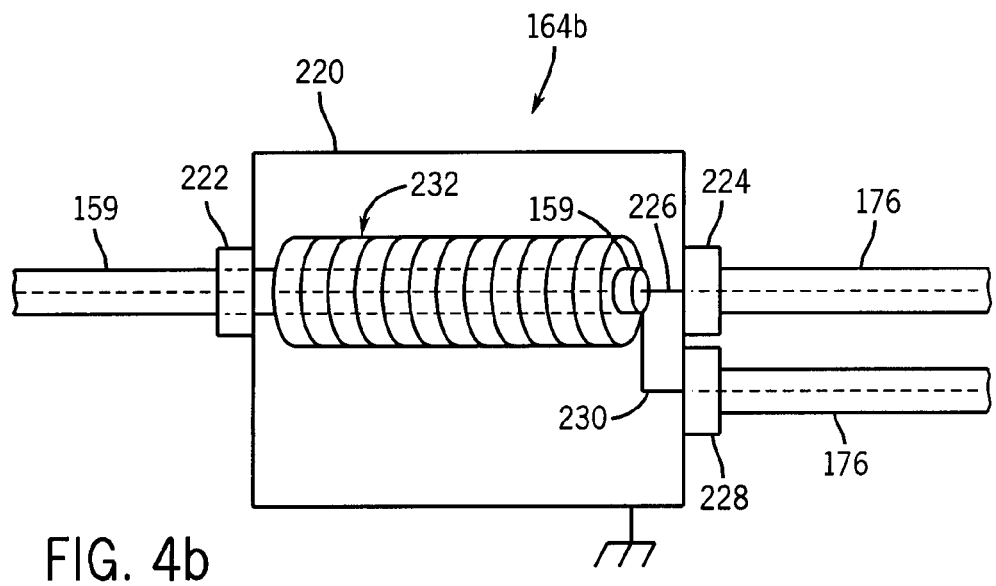
Figure 4C:
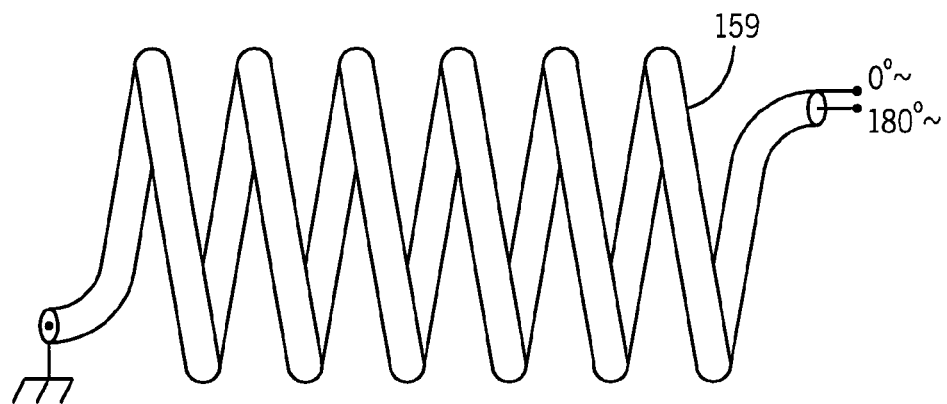

Referring particularly to FIG. 4(b), ferrite bead balun 164B includes a conductive housing 220 which supports at one end a connector 222 that receives the coaxial cable 159 (or 161) from the phase combiner/splitter 157. The end of coaxial cable 159 extends through connector 222 and into the housing 220 where it terminates near a connector 224 mounted to the other end of the housing 220. The connector 224 terminates one of the coaxial cables 176 from the tune and match circuit 173, and it provides a means for connecting the center conductor 226 in both cables directly together. A second connector 228 is mounted adjacent the connector 224 and it terminates the other coaxial cable 176 from the tune and match circuit 173. The connector 224 provides a means for extending the center conductor 230 into the housing 220 where it connects to the shield on the coaxial cable 159. The shields on both coaxial cables 176 connect to the conductive housing 220 that connects to circuit ground.

To provide the desired current balance under all operating conditions a set of annular-shaped ferrite beads 232 are "strung" along the run of cable 159 that is inside the housing 220. The ferrite beads prevent the sheath current on the outer surface of the cable 159 shield by providing an impedance of thousands of ohms. As a result, the balun 164B forces current flow of equal but opposite magnitude in the center leads 226 and 230 of the respective coaxial cables 176.

The balanced, phase conjugate current flow at the output of a current balun is important for proper operation of the RF resonator 172. In a preferred embodiment, the common mode rejection of the current balun 164 should be sufficient to closely match the currents in each conductive arm of a conjugate pair.

Referring again to FIG. 3, each of the four resonator-side connectors on the current balun pair 165 is connected to a respective conductive leg 170 in the resonator 172 through a respective tune and match circuit 173. A feedline such as coaxial cable 176 is used to connect a balun terminal 167 to its respective tune and match circuit 173. Similarly, feedlines such as coaxial cables 178 are used to connect the tune and match circuits to the conductive legs 170 in the resonator 172.

Figure 5A:
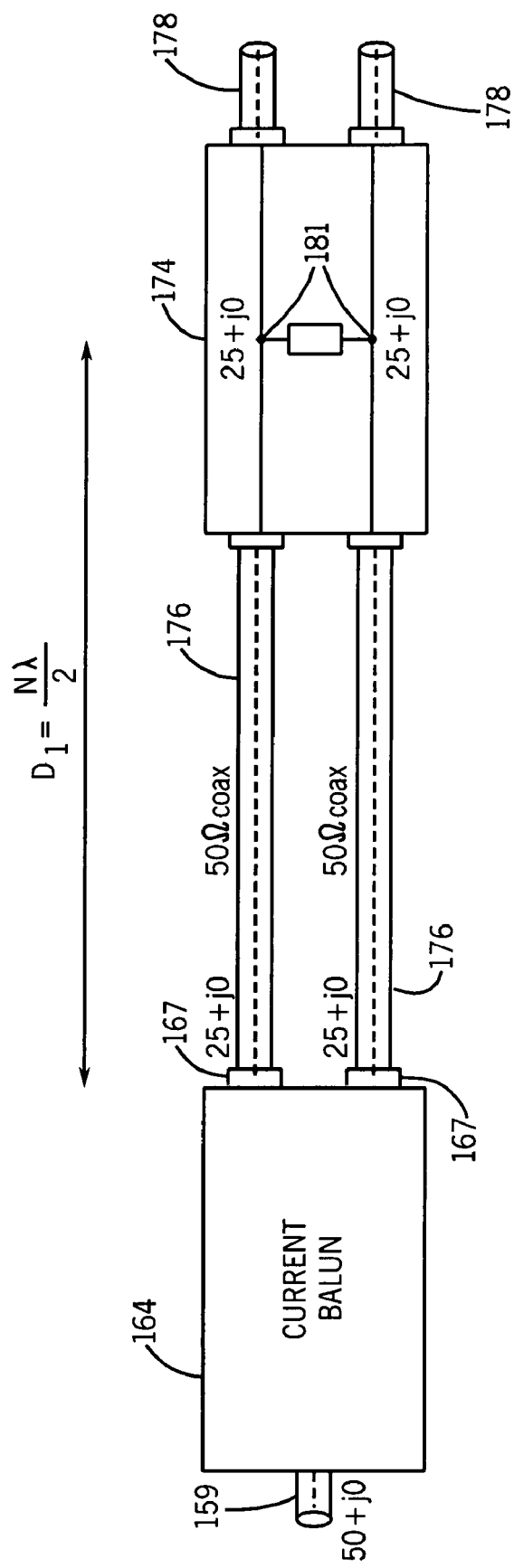
FIG. 5(a) is a portion of the coil assembly of FIG. 3 and provides an example of desired impedance values at various locations.

As shown more particularly in FIG. 5(a), in one embodiment, coaxial cable 176 has a characteristic impedance of 50 ohms. The two pieces of coaxial cable 176 extending from a current balun 164 together form a balanced, shielded line. The tune and match circuit may include a conductive housing or box. The coaxial cables 178 extending from tune and match circuit pair 174 also have a characteristic impedance of 50 ohms and each has a length selected to present in combination with the tune and match circuit 173 a purely resistive load of 25 ohms at a respective match point 181. Each tune and match circuit operates to null the susceptance component of the admittance at match point 181 (equivalent to nulling the reactive component of the impedance at this point). This purely resistive load of 25 ohms is also desired at output terminals 167 of the current balun 164, and can be achieved by properly selecting the lengths of the pieces of coaxial cable 176. In particular, the 25 ohm resistance of the resonator as seen at match point 181 repeats at each of the two terminals 167 on the balanced end of the balun provided that the two lengths of 50 ohm coaxial cable 176 forming the balanced line are approximately $\lambda/2$ in length (where $\lambda$ corresponds to a desired Larmor frequency) or some integral multiple thereof. Since loads across the output side of the balun are in series, the two 25+j0 impedances at output terminals 167 add to 50+j0, which is seen looking into the input terminal (unbalanced port) of each balun 164.

Figure 5B:
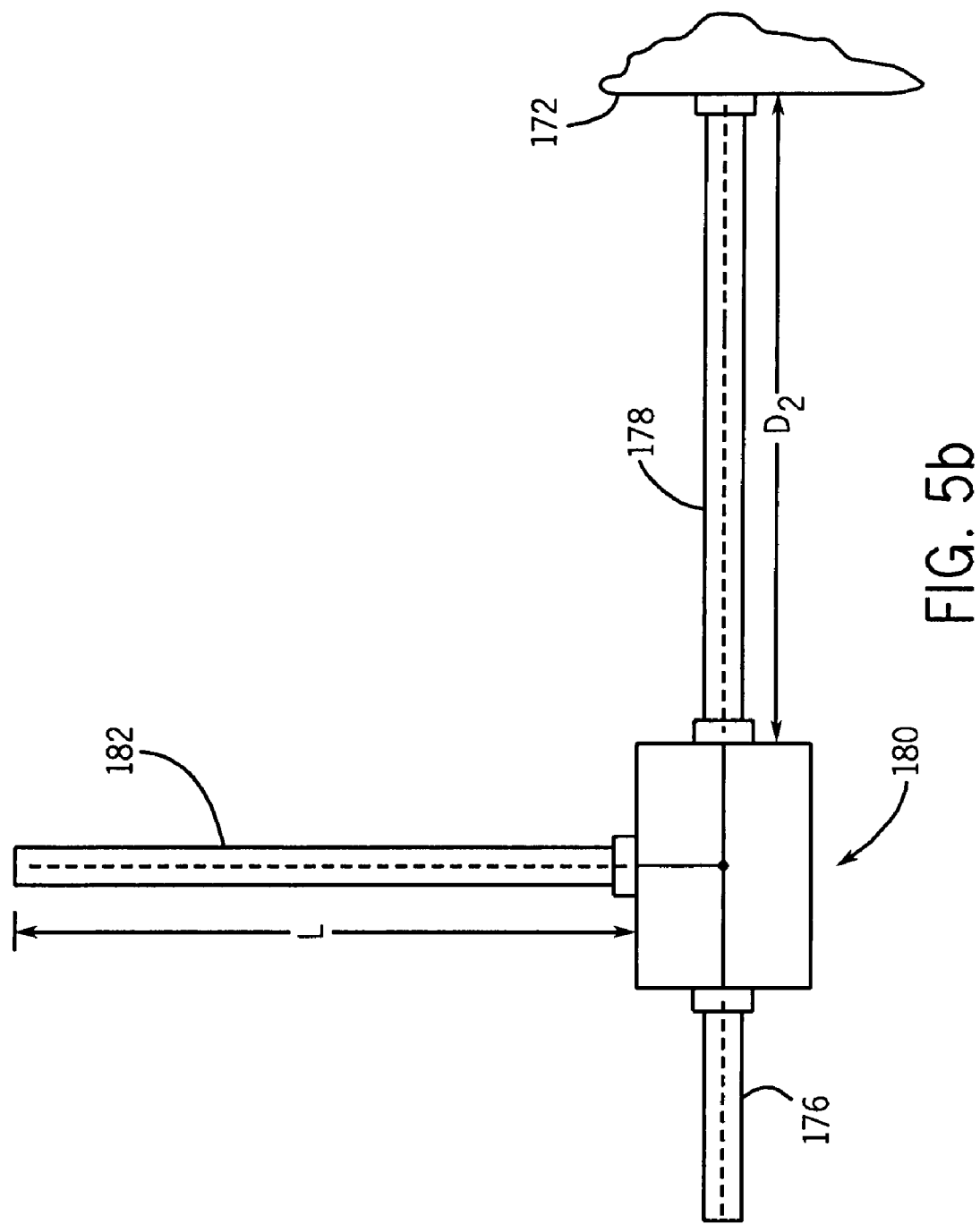
FIG. 5(b) is a pictorial representation of one construction of a tune and match circuit which may form part of the coil assembly of FIG. 3.

One embodiment of a tune and match circuit 173 is illustrated in FIG. 5(b) and includes a "T" connector 180 and a measured length (L) of feedline such as a 50 ohm coaxial cable stub 182 connected as a shunt stub matching circuit. This is a well known circuit for matching a transmission line to a load. The load in this case is the resonator 172, and matching is achieved by inserting the T-connector 180 into the feedline at a specific distance $D_2$ from the resonator 172 and adjusting the length L of cable 182 to null the susceptance component of the admittance at the match point 181 (equivalent to nulling the reactive component of the impedance). The end of the cable 182 is shorted in this embodiment, but it can also be an open circuit with an appropriate adjustment in length L. It should be noted that the characteristic impedance of the feedline is not critical provided the length is appropriately adjusted to provide the required nulling.

The distance $D_2$ from the resonator 172 at which the T connector 180 is inserted is chosen such that the resistive component of the resonator impedance is 25 ohms. This is the point on the Admittance Smith Chart, as one moves from the resonator 172 to the balun 164, where the constant admittance circle intersects the 2.0 normalized conductance circle. An inductive susceptance will also exist at this point, and it is this susceptance that is nulled by proper selection of length L of cable 182 as described above.

Figure 5C:
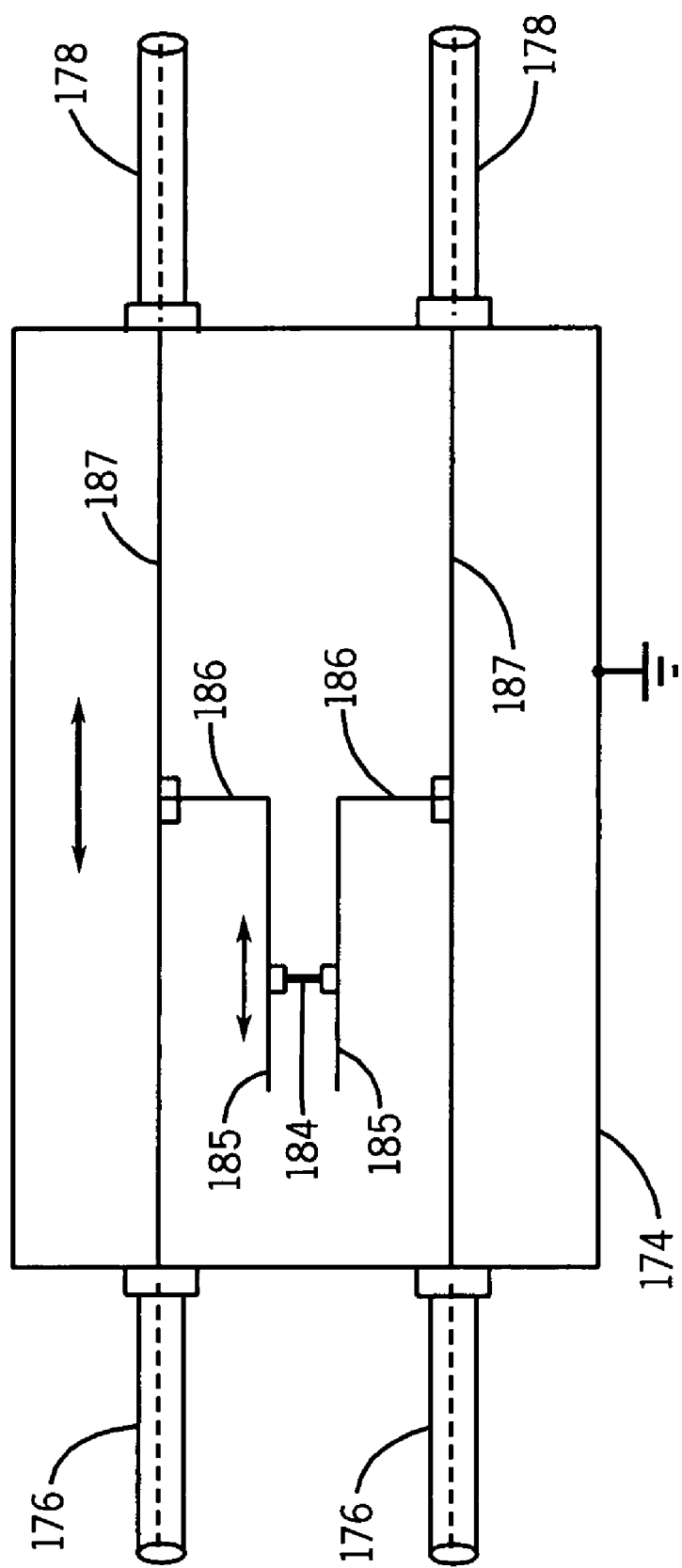
FIG. 5(c) is a pictorial representation of another construction of the tune and match circuit which may form part of the coil assembly of FIG. 3.

FIG. 5(c) illustrates another embodiment of a tune and match circuit pair 174 where each individual circuit is similar to that shown in FIG. 5(b) and includes stubs 186. Translation of the short bar 184 along portions 185 varies the stub length and hence the susceptance component jB of each stub 186, while translation of the pair of stubs 186 along portions 187 operates to move along a constant admittance circle to a desired match point.

Figure 6A:
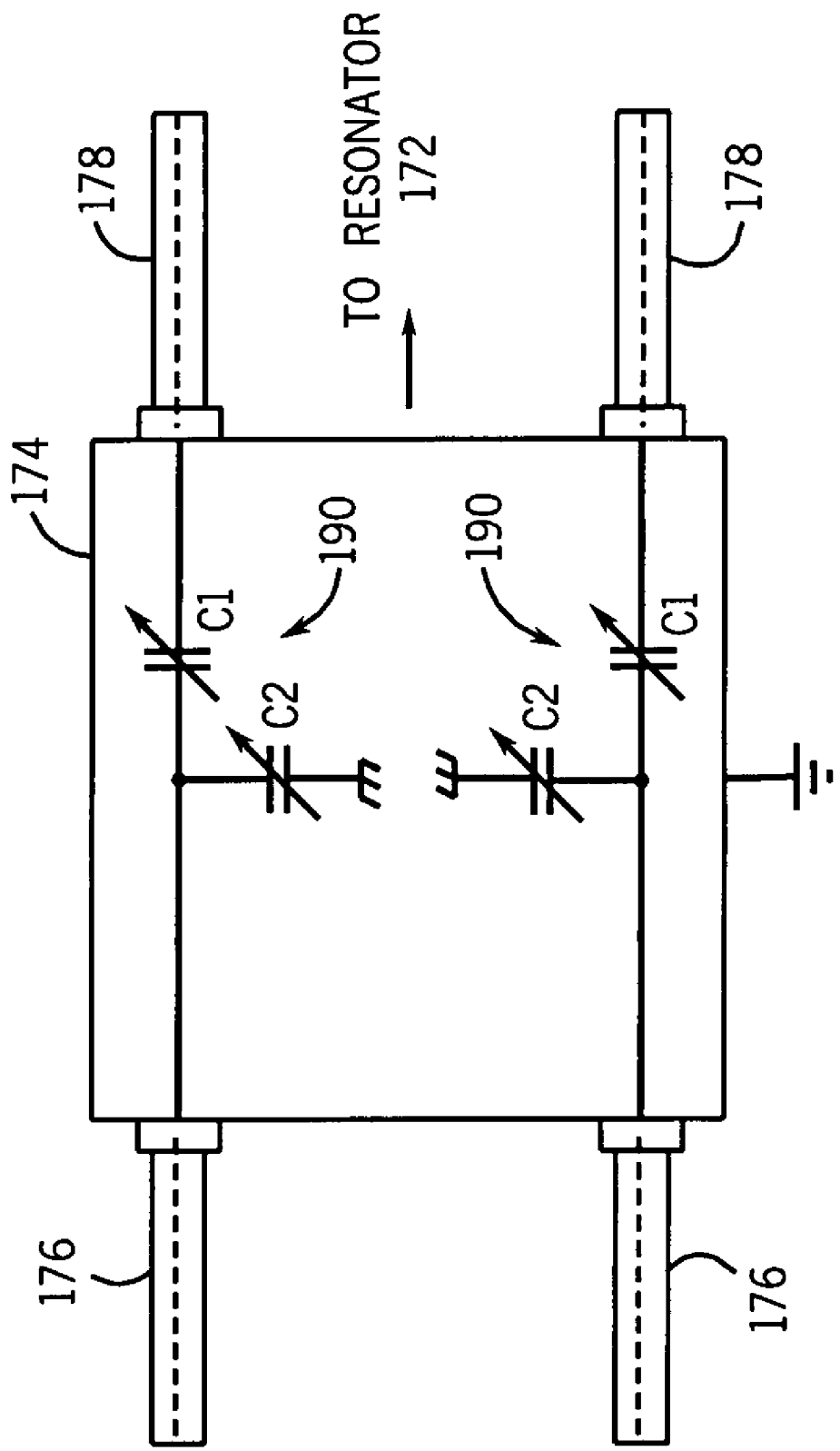
FIG. 6(a) is a pictorial representation of another tune and match circuit including a capacitive L network.

FIG. 6(a) illustrates an embodiment of a tune and match circuit pair 174 including a pair of capacitive L circuits 190 each including a capacitor C1 connecting the center conductors of respective cables 176 and 178 and a second variable shunt capacitor C2 connected between a respective center conductor and ground. The capacitive L circuit 190 may be inserted at match point 181 as measured from load (resonator) to generator, such that the capacitive L may be "tuned and matched" to give a 25 ohm resistive load at that point. In this case, capacitor C1 has the effect of varying the effective length of the line between the resonator 172 and the match point 181 so that the 2.0 normalized conductance circle may be intersected on the Admittance Smith cart. The inductive susceptance is canceled at this point with the capacitor C2.

Figure 6B:
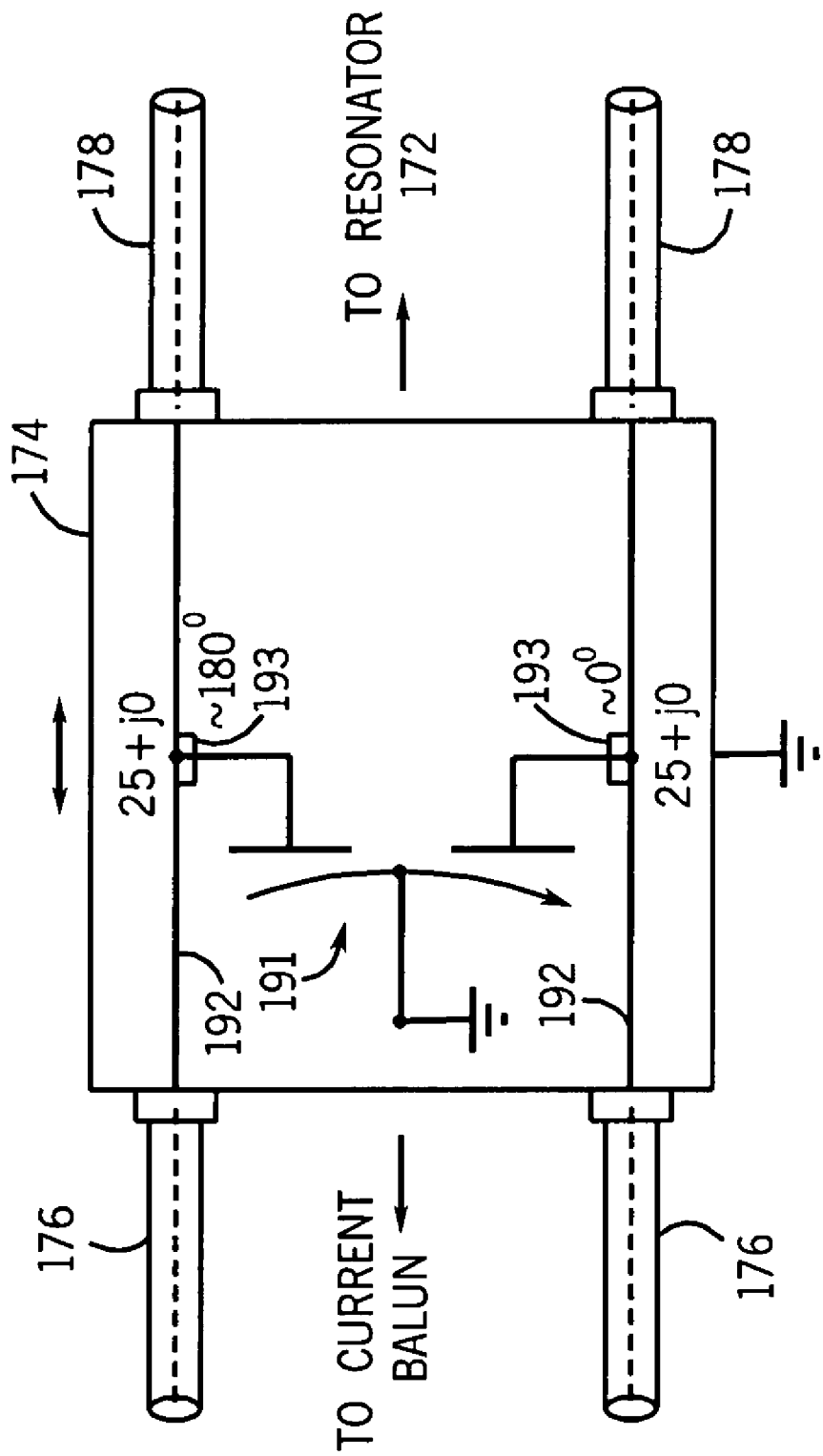
FIG. 6(b) is a pictorial representation of another tune and match circuit including a butterfly variable capacitor.

Another embodiment is illustrated in FIG. 6(b) and involves the use of a butterfly capacitor 191, or common rotor-dual stator variable capacitor specifically designed for use in balanced RF circuits. A butterfly capacitor is a form of rotary variable capacitor with two independent sets of stator plates opposing each other, and a butterfly-shaped rotor arranged so that turning the rotor will vary the capacitances between the rotor and either stator equally. The rotor end can be grounded as shown or left floating. The butterfly capacitor 191 may be mounted astride a segment 192 of balanced line using conductive clips 193 in such a way that it may be translated in the generator or load direction (i.e., towards the current balun or towards the resonator 172) some short amount. Thus, the butterfly capacitor 191 may be translated until the 2.0 normalized conductance circle is intersected on the Smith Chart, and the inductive susceptance may then be canceled by setting the butterfly capacitor to the appropriate value of susceptance jB by rotation of the rotor.

Figure 6C:
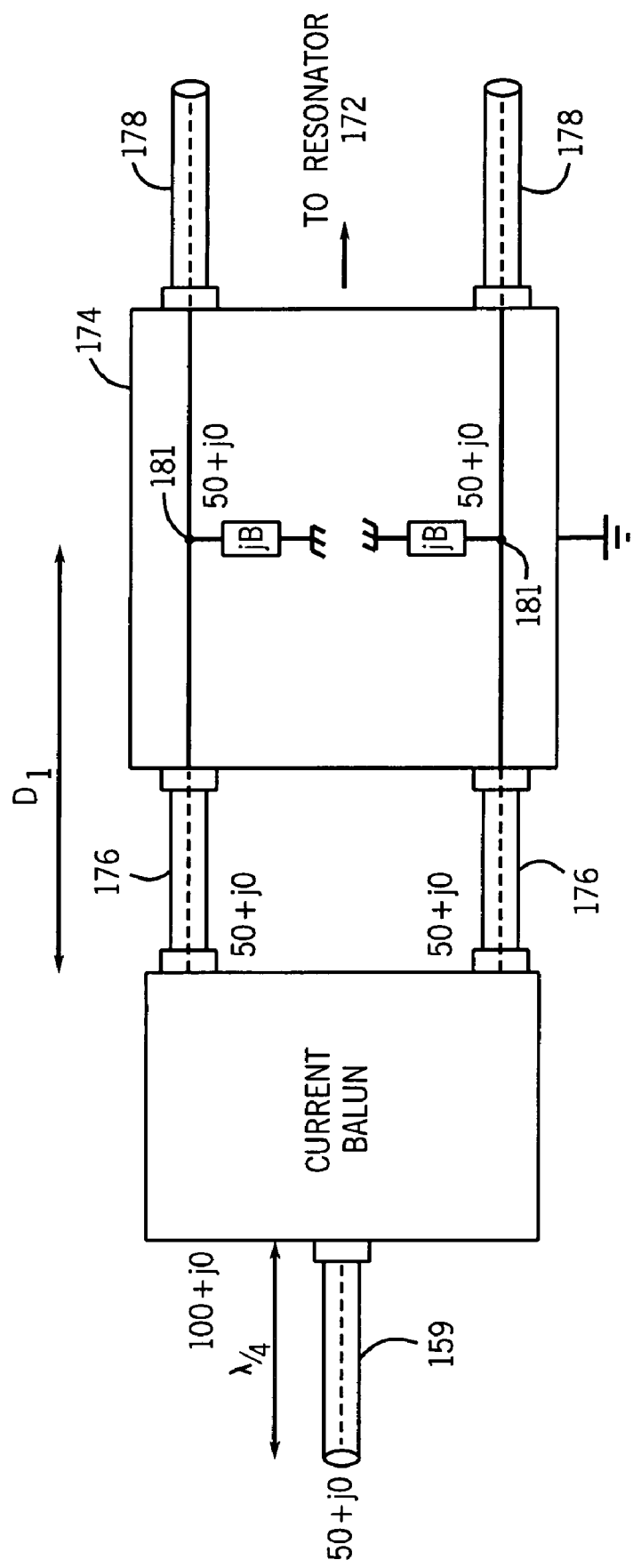
FIG. 6(c) is a portion of the coil assembly of FIG. 3 and provides another example of desired impedance values at various locations.

In other embodiments, coil assemblies can be constructed such that desired impedances other than 25+j0 ohms at match point 181 are obtained. For example, referring to FIG. 6(c), if a value of 50+j 0 ohms is desired at match point 181, then the susceptance component jB can be nulled at the match point in one of the ways described above. In this case however, the location of the match point would correspond to the point where the constant admittance circle intersects the 1.0 (unit) conductance circle, rather than the 2.0 normalized conductance circle as in the other embodiments. Further in this case, if the characteristic impedance $Z_0$ of the coaxial cable 176 is 50 ohms, since $Z_L=Z_0$, the distance $D_1$ from the match point 181 to the current balun terminals can be arbitrary. Additionally, an impedance of 100+j0 ohms then appears at each current balun input. This can then be transformed to 50 ohms for interfacing with the phase/combiner splitter 157 with for example a λ/4 length of coaxial cable 159 having a characteristic impedance of 70.7 ohms. A stripline tapered line could also be used.

Figure 7:
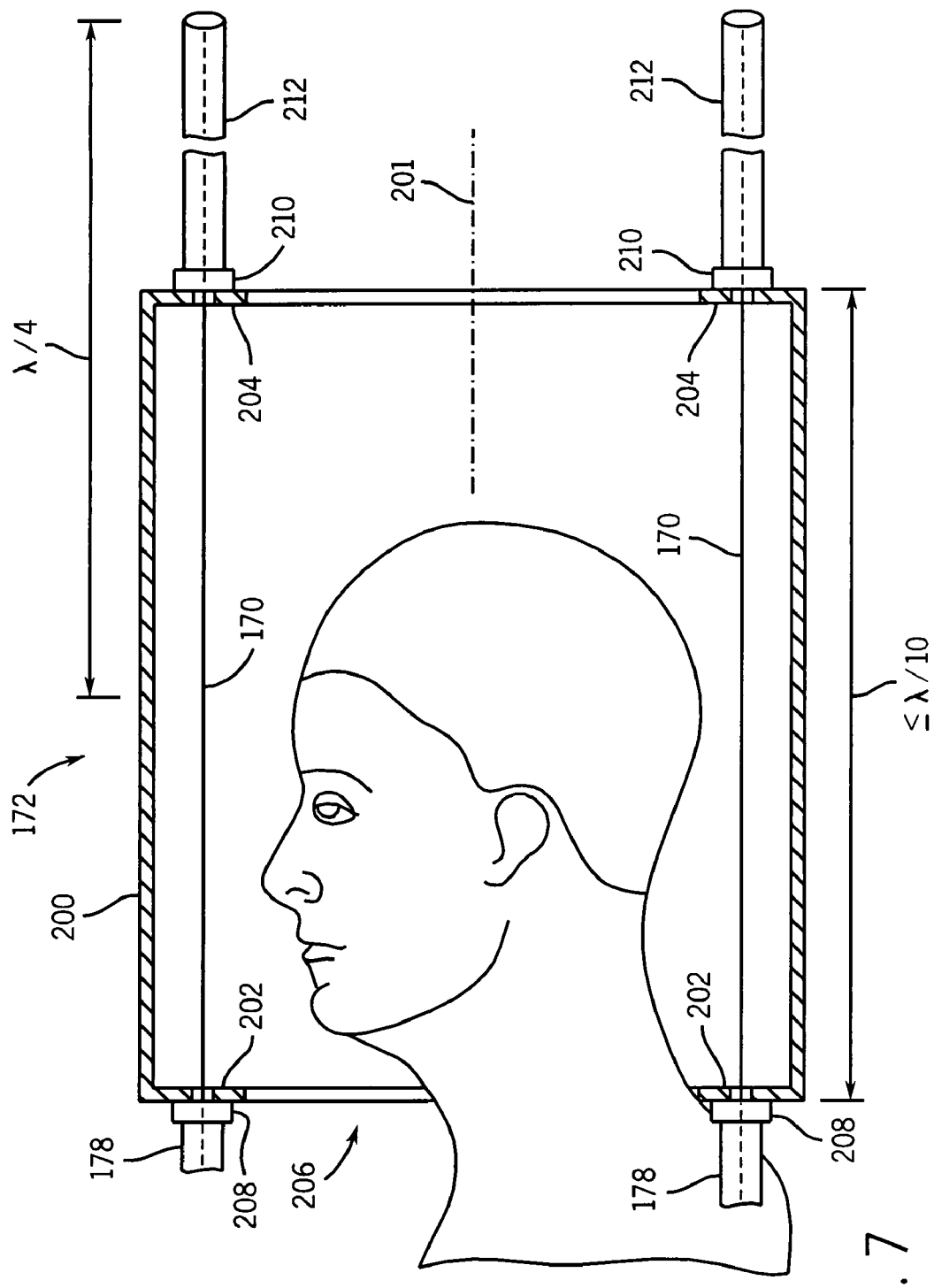
FIG. 7 is a pictorial representation of a first preferred RF resonator that forms part of the coil assembly of FIG. 3.

Referring particularly to FIG. 7, the first preferred embodiment of the resonator 172 is in the form of a local coil, or head coil. It includes a circular cylindrical shield 200 which extends radially inward toward a central axis 201 at each of its ends to form respective annular shaped mounting rings 202 and 204. The shield 200 includes an insulating supporting substrate such as a Lucite™ tube and a double foil Faraday copper shield on opposing surfaces of the substrate as described in U.S. Pat. No. 5,680,046 which is incorporated herein by reference. The mounting rings can also be formed from Lucite™ material. In this embodiment the shield 200 is sized to receive the head of a subject to be examined in a circular opening 206 defined by the inner edge of the mounting ring 202.

The mounting ring 202 provides a surface to which four connectors 208 may be attached for receiving the cables 178 from the circuitry described above. Note that the mounting rings 202 and 204 are not required, and in other embodiments a portion or all the connectors can be provided on the shield 200 such that the feed lines form right angles with the conductive legs and/or the terminal susceptance elements form right angles with the conductive legs. As will be described in more detail below, the connectors are preferably equally spaced about the circumference of the mounting ring 202 and symmetry is maintained. The shield on each cable 178 connects to the resonator shield 200 and its center conductor passes through an opening in the mounting ring 202 and connects to one end of a conductive leg 170. In essence, the resonator shield 200 is an extension of the cable shield which is expanded radially to receive the subject to be examined.

The multiple conductive legs 170 extend through the cavity defined by the shield 200 parallel to a central axis 201 and attach to corresponding connectors 210 attached to the mounting ring 204 at the opposite end of the resonator 172.

The conductive legs 170 are constructed of a very low resistance material which is formed very thin to avoid eddy currents induced by changing gradient coil fields. Highly polished copper or polished silvered copper is preferred and the legs are shaped as tubes or ribbons to provide mechanical rigidity. For example, conductive copper tape placed over a cylindrical form of Lucite™, polyethylene, or other suitable material offers a convenient and economical way to form an array of conductive legs. Each conductive leg 170 is spaced radially inward from the cylindrical or Faraday shield 200. The distance of each conductive leg 170 from the adjacent Faraday shield 200 is adjusted to optimize the homogeneity of the RF magnetic field within the resonator central cavity where the subject to be examined resides. The distance will be a function of the diameter of the resonator, but it is not a function of the resonant frequency to which the conductive leg 170 is tuned. Thus, the conductive legs 170 can be tuned to different Larmor frequencies with no mechanical changes within the resonator shield 200.

The connectors 210 at the back end of the resonator 172 support terminal susceptance elements such as termination stubs 212 (of coaxial cable) in such a manner that a homogeneous magnetic field is produced within the resonator cavity. Each terminal susceptance element is chosen to give a current maximum and a voltage minimum at the midpoint of each conductive leg 170. In this embodiment, the conductive legs 170 and termination stubs 212 function as uniform transmission lines, and the characteristic impedance of each can be designated as $Z_0^{cond}$ and $Z_0^{stub}$ respectively. It follows that one can also speak of corresponding characteristic admittances $Y_0^{cond}$ and $Y_0^{stub}$, where the admittance Y is simply the reciprocal of the impedance: Y=1/Z. It should be noted that both are complex quantities, wherein Z=R+jX, and Y=G+jB. Thus, impedance is the vector sum of a resistive component R and a reactive component X. Correspondingly, admittance is the vector sum of conductance G and a susceptance component jB To effect a virtual short at the midpoint of each conductive leg requires that the susceptance of the stub jB be equal to that of an open circuit stub of length [¼λ−L/2] whose characteristic admittance $Y_0^{stub}$ is identical to $Y_0^{cond}$. The quality of this short depends on the Q of the stub 212: a high Q will effect a virtual short of very high conductance. A similar analysis holds for short circuited stubs. The short circuited termination stubs will perform best when the short circuits are made with high quality preferably silver solder joints, which should be polished and free of oxides for the highest possible RF conductance. It is also good practice to keep the conductive legs 170 polished and free of oxides.

If $Y_0^{cond} \ne Y_0^{stub}$, the effective susceptance of the stub must be determined by normalizing the admittance of the stub with respect to $Y_0^{cond}$, the characteristic admittance of the conductive leg. In the case where $Y_0^{cond} < Y_0^{stub}$, or $Z_0^{cond} > Z_0^{stub}$, the stub lengths required for a virtual short at conductive leg midpoint will be shorter than those required in the case where $Y_0^{cond} = Y_0^{stub}$. This case offers some practical advantage as shorter termination stubs are more compact.

One may measure $Z_0^{cond}$ and thus obtain $Y_0^{cond}$ from open circuit and short circuit impedance measurements of a single conductive leg at a frequency where the length of the transmission line resonator body corresponds to an odd integral multiple of $\lambda/8$. This insures that both measurements will be of comparable magnitude, and won't be near the extremes of an instrument's range. From these measurements, an excellent estimate of $Z_0^{cond}$ can be obtained from the equation:

$$Z_0^{cond} = \sqrt{Z_{sc}^{cond} \times Z_{oc}^{cond}}$$

The desired virtual short at conductive leg midpoints may be verified by looking into the input terminal of a current balun whose output terminals are connected to both legs of a conjugate pair of the resonator. If the distance between balun input and resonator leg midpoints is $\lambda/2$ or an integral multiple thereof, a short circuit will be seen if stub susceptance (reactance) is correct.

Figure 8:
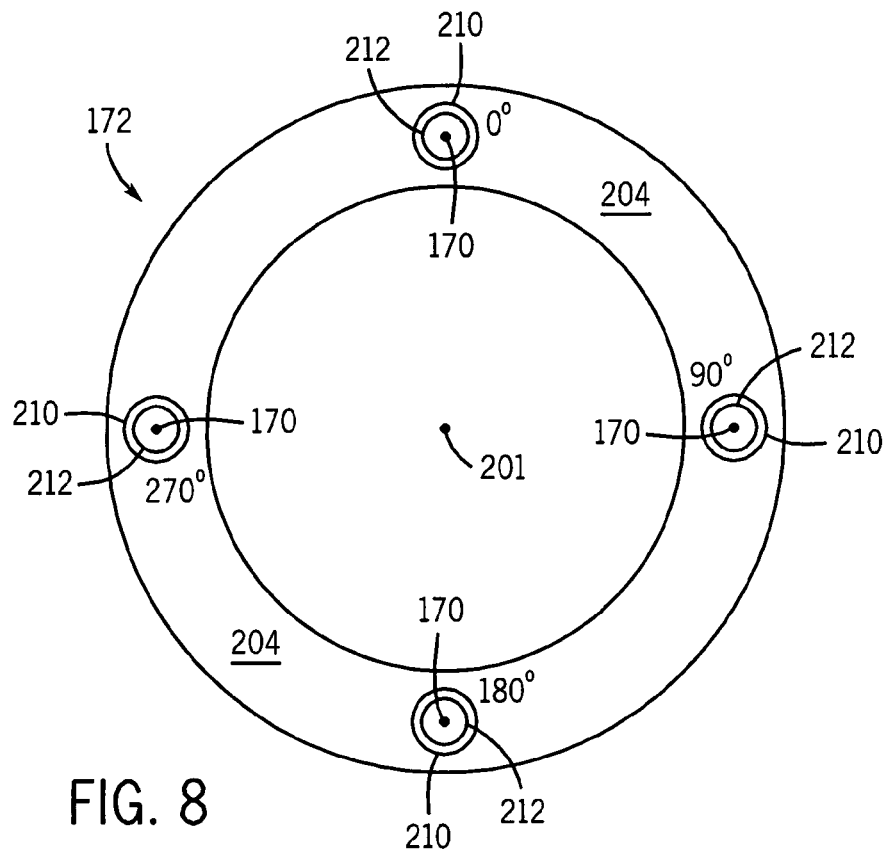
FIG. 8 is a pictorial representation of an end view of the RF resonator of FIG. 7.

As shown in FIG. 8, the four conductive legs 170 are spaced evenly around the circumference of the resonator 172. The symmetry required to obtain a homogeneous RF magnetic field within this resonator demands that current flow be equal and opposite to each other on opposite sides of the central axis 201. This is achieved by symmetrically positioning pairs of opposing conductive legs around the central axis 201. In the four element resonator, one opposing pair of conductive legs 170 are positioned at 0° and 180°, and a second opposing pair are positioned at 90° and 270°. This is the geometric aspect of the required symmetry. An additional requirement is that the opposing conductive elements conduct equal, but opposite currents. As will be described below, more conductive legs 170 and associated drive circuitry can be added to improve field homogeneity, but in all cases they must be arranged to maintain the above symmetry.

Another embodiment of the RF resonator 172 that is suitable for use as the whole-body RF coil 34 at 3 T and higher fields would include two resonators of perhaps 25 cm in length which are nested front to front, with the sense of the circular polarization being reversed in one of them. The B1 fields of the two would combine to give a homogeneous field over a length of 50 cm or more.

Figure 9:
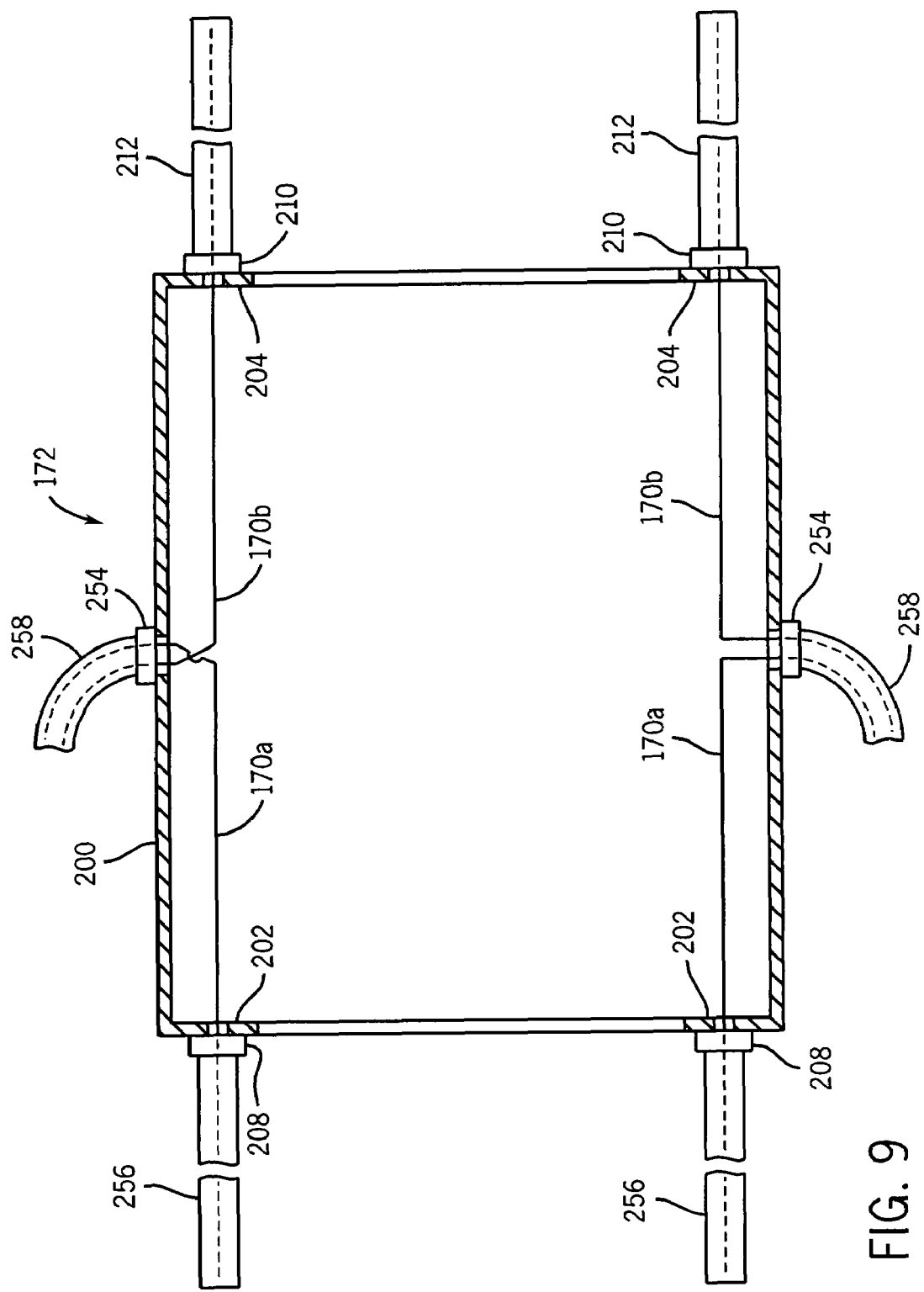
FIG. 9 is pictorial representation of a second preferred RF resonator that forms part of the coil assembly of FIG. 3.

Another embodiment of the RF resonator 172 that may be suitable for use as a whole-body RF coil 34 is shown in FIG. 9. The shield 200 and mounting rings 202 and 204 are essentially the same as described above, except they are scaled up in size. To maintain a desired homogeneous RF magnetic field over a larger volume, the conductive legs 170 are divided into two equal leg segments 170a and 170b and driven from a midpoint rather than the front end of the resonator. More particularly, a front conductive leg segment 170a connects at a midpoint connector 254 and extends forward through the connector 208 into a termination stub 256. Similarly, a rear conductive leg segment 170b connects at the midpoint connector 254 and extends rearward through connector 210 and into the termination stub 212. The termination stubs 256 and 212 are identical and they are tuned as described above to produce maximum current and minimum voltage at the midpoint of the resonator at a Larmor frequency of choice.

Figure 10:
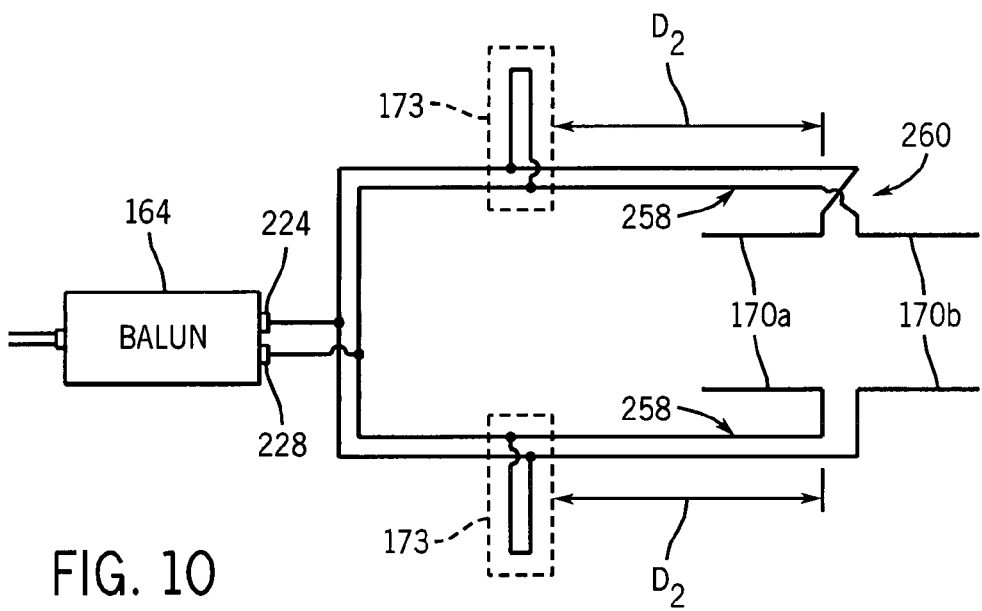
FIG. 10 is a schematic representation of the changes required to drive the RF resonator of FIG. 9.

The conductive leg segments 170a and 170b connect to the conductors in a twin-lead, low impedance cable 258 that terminates at the midpoint connector 254. As shown in FIG. 10, the twin lead cables 258 extend a distance D to a respective tune and match circuit 173 and the two leads therein extend to and connect to the two phase conjugate connectors 224 and 228 on the balun 164. Each conductive leg segment pair 170a and 170b forms a dipole antenna and to maintain the symmetry described above that is required for a homogeneous magnetic field, the leads to one of the two dipole antennas are switched as indicated at 260 to change its phase 180° with respect to the opposing dipole antenna.

In the first embodiment of the resonator 172 described above there exists a virtual short circuit at the midpoint of each conductive leg 170. This virtual short point is a voltage node where the electric field is very small and dielectric losses are minimal. The current distribution along the length of each conductive leg 170 is peak at its midpoint and drops off sinusoidally as a function of distance from this midpoint and the wavelength ($\lambda$) corresponding to the Larmor frequency. This drop-off condition requires that the axial length of the resonator 172 be limited to less than $\lambda/10$ in order to maintain homogeneous magnetic fields and keep electric field magnitudes acceptably low. This is not a problem when the resonator is used at lower polarizing fields (i.e. longer Larmor frequency wavelength) or the resonator is a relatively small local coil.

The embodiment of the resonator 172 illustrated in FIG. 9 relieves this constraint by a factor of two. By driving each conductive leg 170 at its midpoint rather than one end, the length of the resonator is limited to $\lambda/5$ rather than $\lambda/10$. This results because the end of each conductor at the feed point is precisely $\frac{1}{4}$ wavelength away from the open circuit stub end, or is an odd integral multiple thereof. Alternatively, if this stub end is short circuited, the wavelength is $n*\lambda/4$, where n is an even integer.

There are many possible variations from the preferred embodiment of the coil assembly described above. To improve the RF magnetic field homogeneity, particularly in larger coil assemblies, additional pairs of opposing conductive legs 170 can be added to the RF resonator 172. This, of course, requires additional circuitry to drive these conductive legs 170. Also, it is possible with the present invention to employ multiple Larmor frequencies and acquire NMR signals from two or more spin species simultaneously without interference.

Figure 11:
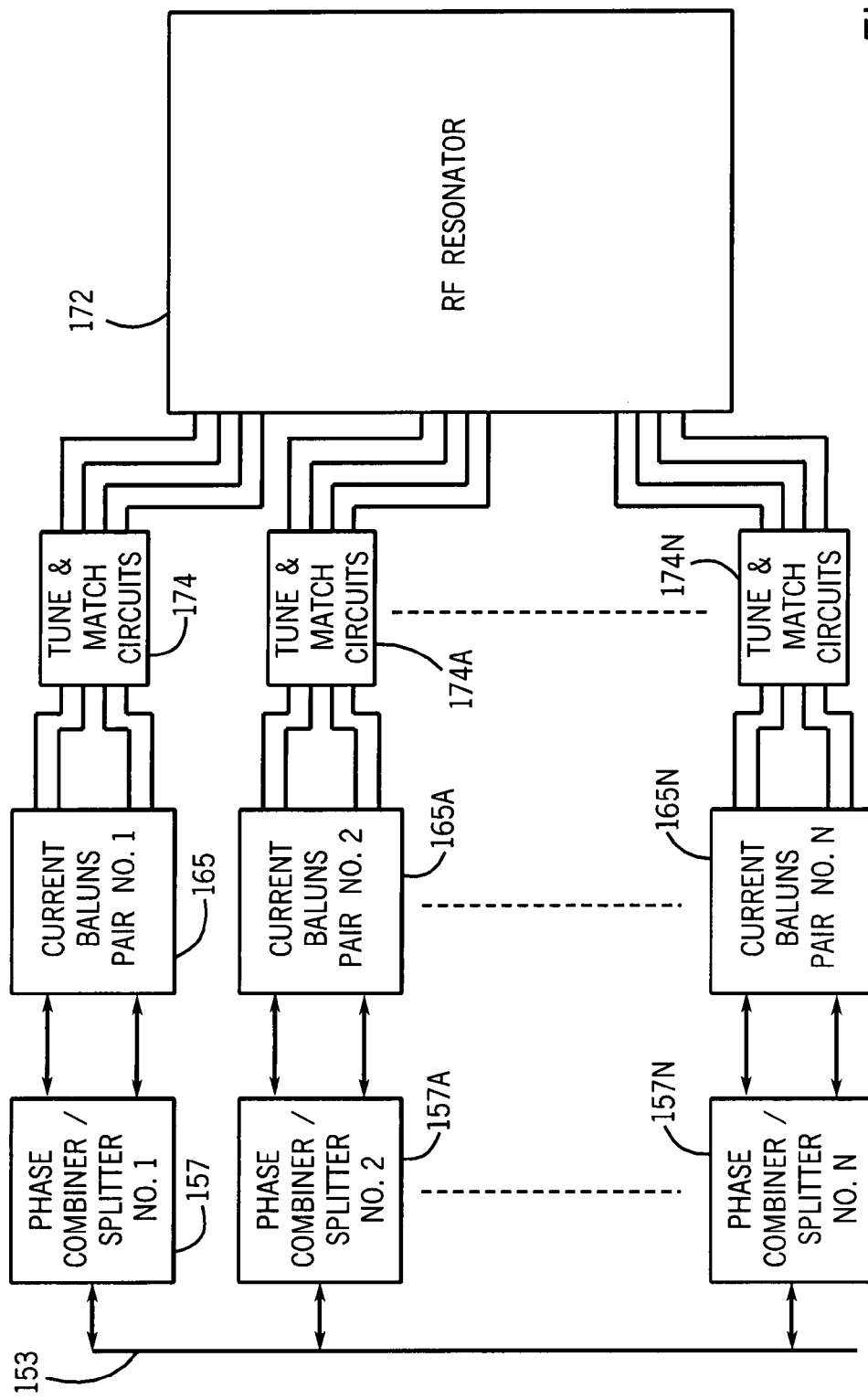
FIG. 11 is an alternative embodiment of the coil assembly that forms part of FIG. 2.
Figure 12:
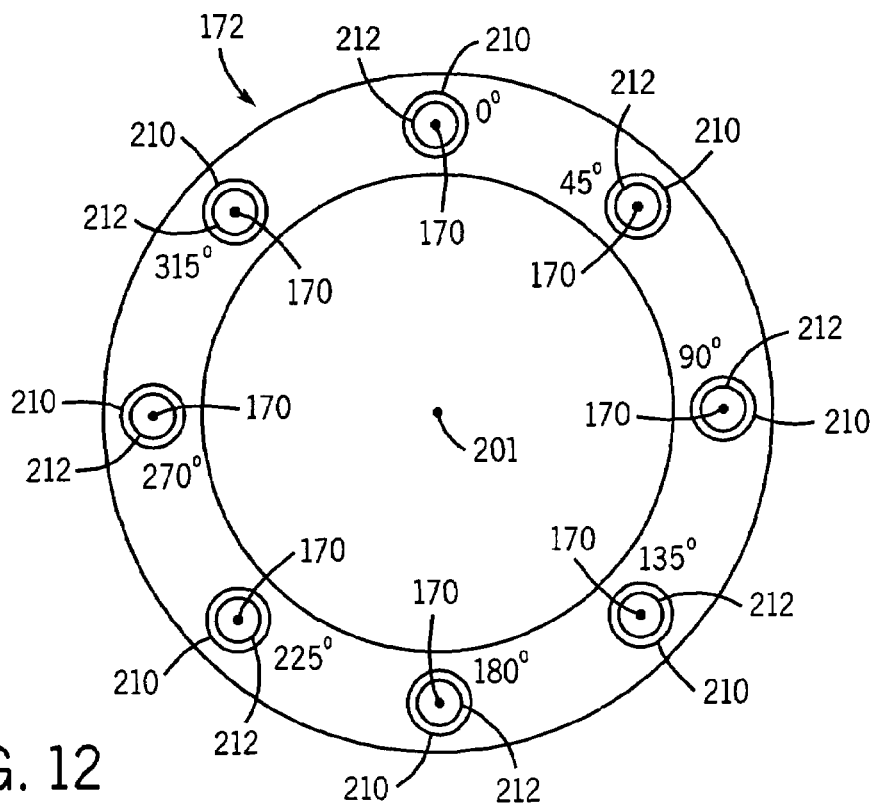
FIG. 12 is a pictorial representation of an end view of the RF resonator of FIG. 11.

An embodiment of the invention in which the number of conductive legs 170 is increased is shown in FIG. 11. The number of conductive legs 170 used in local coils such as that shown in FIG. 8 will typically be eight and these legs 170 are driven by two sets of drive circuits comprised of the above-described phase combiner/splitter 157, current balun pair 165 and tune and match circuit pairs 174. Whereas the first phase combiner/splitter 157 serves phases 0° and 90°, the second phase combiner/splitter 157A serves phases 45° and 135° and the second current balun pair 165A serves phases 45°, 135°, 225° and 315°. As shown in FIG. 12, the eight conductive legs 170 in this embodiment of the resonator 172 are disposed equidistantly around the circumference of the resonator 172 and the above-described symmetry in both position and current phase is maintained.

Referring still to FIG. 11, the number of sets of drive circuits can be increased to support additional conductive legs 170 in the resonator 172. Each set of drive circuits 157, 165 and 174 will support two opposing pairs of conductive legs 170 that are positioned in quadrature relationship to each other around the circumference of the resonator 172. The only difference between each such set of support circuitry is the quadrature phase angles produced by the phase combiner/splitter 157 in each set. Table 1 lists the quadrature phase angles and corresponding sets of drive circuitry needed to support increasing numbers of conductive legs.

TABLE 1

| Phases | Total # of Resonator Conductive Legs | Total # of Conjugate Pairs |
|---|---|---|
| 0°, 90°, 180°, and 270°. | 4 | 2 |
| Above plus 45, 135, 225, 315 | 8 | 4 |
| Above plus 22.5, 112.5, 202.5, 292.5 Etc. | 16 | 8 |

Note that geometric symmetric arrangements can be achieved with only certain combinations of conductive legs 170 when quadrature NMR signals are to be generated and received. Nonetheless, it is possible, with special purpose stripline arrays, to build any of the versions in Table 1.

In the above embodiments of the invention, each leg 170 is a resonant transmission line that is tuned to support maximum current and zero voltage at its midpoint for a single Larmor frequency wavelength ($\lambda$). In the embodiment of FIG. 7, tuning is accomplished by adjusting the length of the coaxial termination stubs 212 and the distance D2 between the resonator 172 and the tune and match circuit pairs 174. In the embodiment of FIG. 9, tuning to a particular Larmor frequency is accomplished by adjusting the lengths of both stubs 212 and 256 as well as the distance D2. It should be apparent that the Larmor frequency of the coil assembly 155 can, therefore, be changed rather easily by simply replacing the coaxial stubs 212 (or other terminal susceptance elements) and adjusting the effective length D2 by replacing cables 178 and proper adjustments of the tune and match circuits, as described above.

A discovery of the present invention is that the coil assembly can be used to perform multinuclear NMR measurements simultaneously. This is achieved by tuning selected ones of the conductive legs 170 to the Larmor frequency of one spin species and tuning the Larmor frequency of the remaining conductive legs 170 to another spin species. For example, one Larmor frequency may be that of hydrogen protons and the other Larmor frequency may be that of $^3$He, $^{13}$C, or $^{23}$Na.

Figure 14:
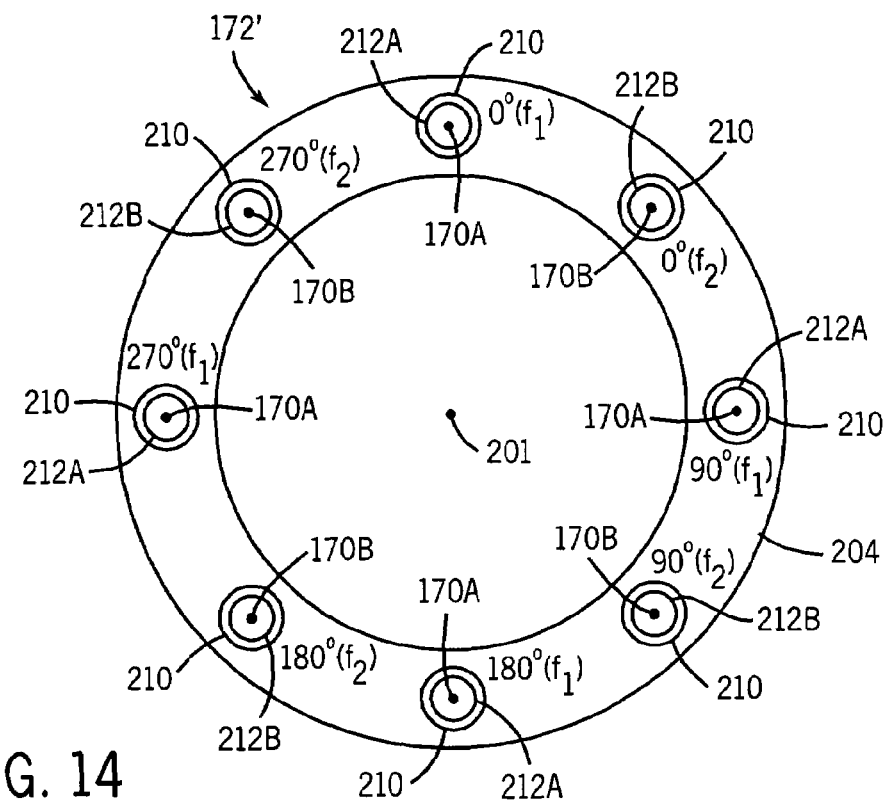
FIG. 14 is a pictorial representation of an end view of the RF resonator in FIG. 13.
Figure 13:
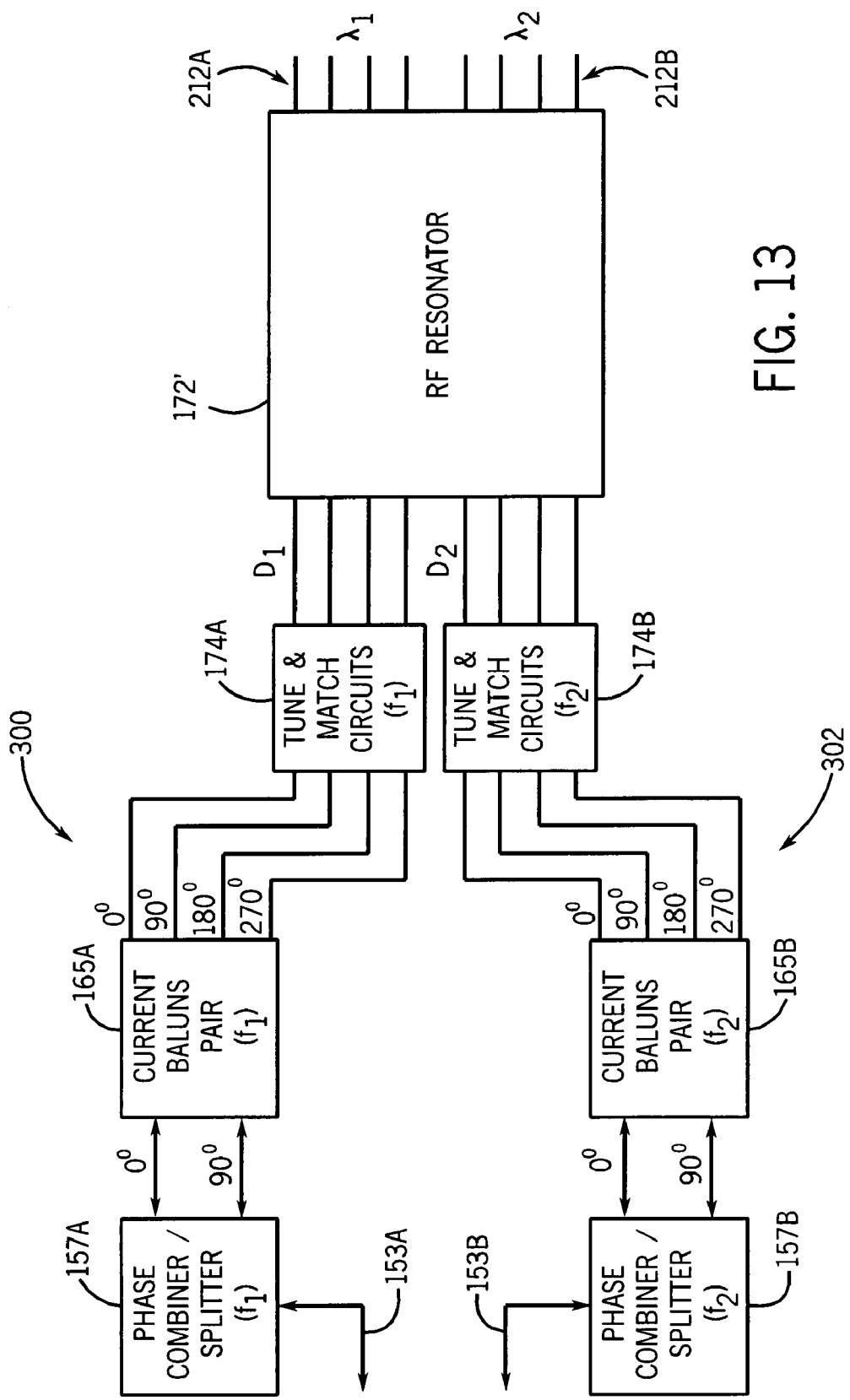
FIG. 13 is another alternative embodiment of the coil assembly that forms part of FIG. 3.

A multinuclear coil assembly for driving an eight-element RF double resonator 172' (similar to the resonator 172 shown in FIG. 7) is illustrated in FIGS. 13 and 14. This embodiment requires two transmitters and two receivers in the RF system 26, which can take the form of two transceivers, one operating at a first Larmor frequency $f_1$ and the second operating at a second Larmor frequency $f_2$. The $f_1$ transceiver couples through a first T/R switch (like T/R switch 152 of FIG. 2) to one set of drive circuitry indicated at 300 and the other transceiver couples through a second T/R switch to a second set of drive circuitry indicated at 302. The drive circuits 300 and 302 are identical to those described above with respective phase combiner/splitters 157A, 157B, current balun pairs 165A, 165B and tune and match circuit's pairs 174A, 174B. For drive circuitry 300, the distance $D_1$ between the tune and match circuit pair 174A and the RF double resonator 172' is adjusted to the length needed for the wavelength $A_1$ corresponding to the Larmor frequency $f_1$, in the same manner described above. Further, the four coaxial stubs 212A for the leg segments 170A driven by the $f_1$ channel are also adjusted in length. The $f_1$ tune and match circuit pair 174A will also be set to null any reactive component at this frequency as described above. Similarly, corresponding adjustments are made for corresponding distance $D_2$, length of coaxial stubs 212B, tune and match circuit pair 174B in the $f_2$ channel such that they are tuned to the wavelength $\lambda_2$ corresponding to the Larmor frequency $f_2$.

As shown in FIG. 14, the four conductive legs 170A driven by the $f_1$ channel are positioned at the physical angles 0°, 90°, 180° and 270° around the circumference of the double resonator 172' and as described above, their associated coaxial stubs 212A are set to the $\lambda_1$ wavelength. The remaining four conductive legs 170B at physical angles 45°, 135°, 225° and 315° are driven by the $f_2$ channel and their associated coaxial stubs 212B are set to the $\lambda_2$ wavelength.

Thus the drive circuitry for the $f_1$ conductive legs 170A and the $f_2$ conductive legs 170B operate exactly as described above for a coil assembly operating at a single Larmor frequency. More specifically, the quadrature rotating field for each frequency $f_1$ and $f_2$ is supported by pairs of opposing conductive legs 170A, 170B oriented 90° with respect to one another. The conductive legs 170A are interspersed with the conductive legs 170B around the mounting ring 204 (at 45° increments with respect to one another shown in FIG. 14) without changing the pattern of their excitation. Note that the electrical phase increments will be the same for both the $f_1$ coil and the $f_2$ coil, namely 0°, 90°, 180°, 270°. This arrangement would normally be problematic due to the magnetic coupling between adjacent conductive legs 170A, 170B at respective frequencies $f_1$ and $f_2$ and a severe distortion of the $B_1$ RF field at each frequency would result for both transmit and receive.

Fortunately, a "happy accident" of nature presents a solution to this problem for some combinations of NMR active nuclei that enables them to be used together. It may be seen that the ratio of the gyromagnetic ratios of $^3$He and $^1$H (proton) are approximately 0.762 as determined by accurate experiment. This ratio is very close to 3/4, and allows for excellent decoupling between the two resonators as will be described below. It may also be seen that the ratio of the $^{13}$C and $^1$H gyromagnetic ratios is very close to ¼; this is another "happy accident" which permits the construction of dual frequency $^{13}$C—$^1$H resonators with excellent mutual isolation between the two, as with $^1$H and $^3$He. This approach may also be used for $^{23}$Na and $^1$H.

Figure 15:
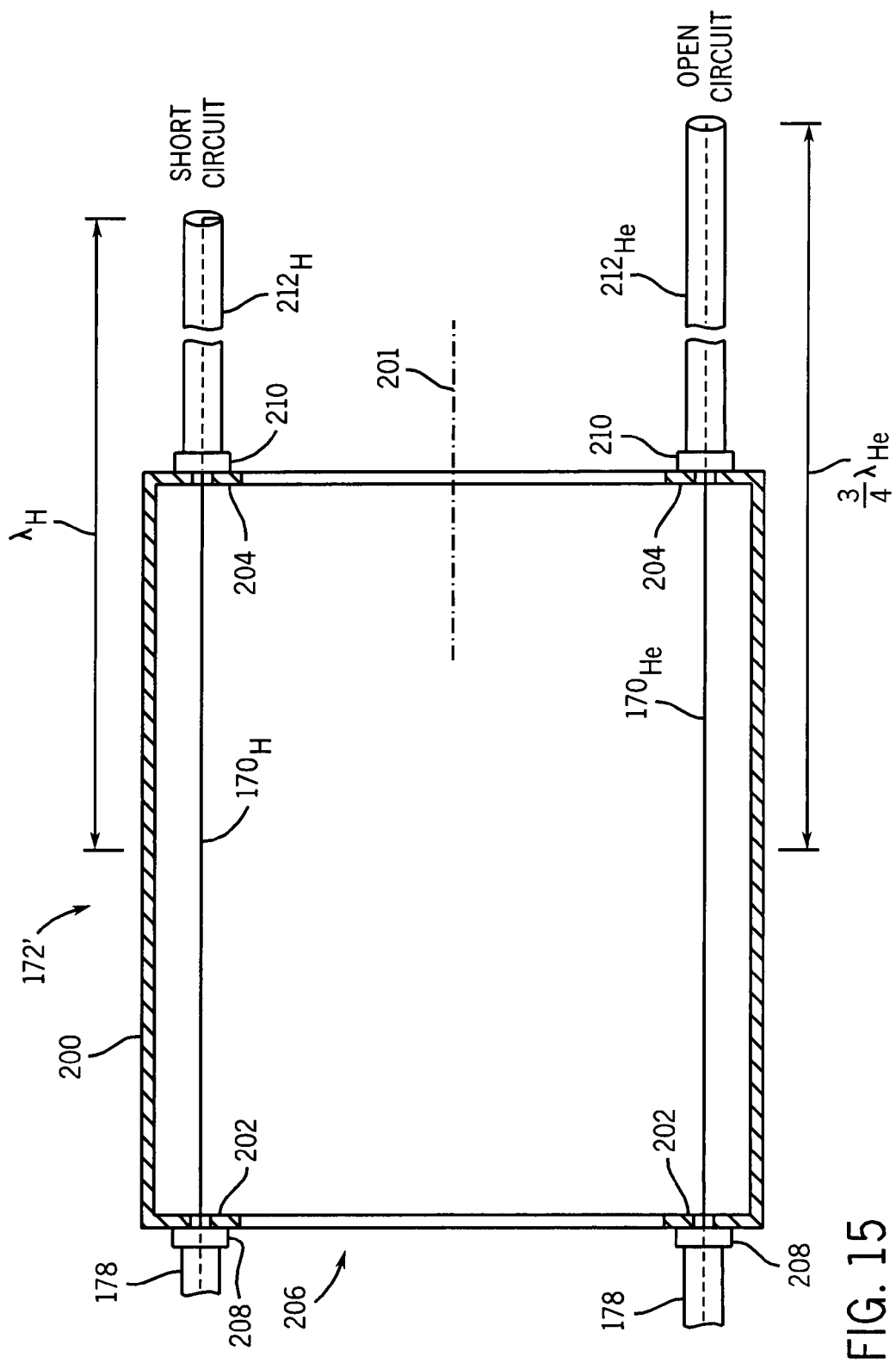
FIG. 15 is a pictorial view of one example of an RF resonator used with the coil assembly of FIG. 13.

Referring particularly to FIG. 15, a double resonator 172' is shown with two pairs of conductive legs, one pair tuned to the Larmor frequency of H1 and the other tuned to the Larmor frequency of $^3$He. The coaxial stub $212_H$ on the hydrogen conductive leg $170_H$ is set to produce a current maximum at its midpoint as described above. This can be achieved with a shorted stub and a distance between the shorted end of the stub and the midpoint of conductive legs approximately equal to one wavelength $\lambda_H$. This length is chosen because at the Larmor frequency of $^3$He, this length produces a current minimum at the same midpoint. Similarly, the coaxial stub $212_{He}$ for the $^3$He conductive leg $170_{He}$ is set to produce a current maximum at the midpoint of the conductive leg $170_{He}$. This can be achieved with an open stub and a distance between the open end of the stub on the midpoint of the conductive leg approximately equal to a length of ¾ $\lambda_{He}$. This length produces a current minimum at the same approximate midpoint for signals at the hydrogen Larmor frequency. A high degree of isolation will be realized because each resonator acts as a stop band filter for the other. This may be understood by considering the load seen by a conductive leg $170_{He}$ if it were to couple with a neighboring conductive leg $170_H$: the coaxial stub $212_H$ inverts a short at the helium 3 frequency, so a very high load is seen by the conductive leg $170_H$ and coupling is minimized. Similarly, a conductive leg $170_H$ sees a very high impedance on neighboring conductive leg $170_{He}$.

This illustrates why termination stubs are used as terminal susceptance elements in the double nuclear coil: unlike a capacitor, a stub can "switch" from capacitive (+) susceptance to inductive (−) susceptance with a change in frequency. In this case, a change in frequency effects a complex inversion of the stub's susceptance at the generator end of the stub. In other words, the stub goes from jB to approximately (−1/jB). Briefly, the best isolation comes when the conductive leg is a near short at its Larmor frequency and a near open circuit at the other Larmor frequency. This means that the respective impedances (admittances) measured at the midpoint of the conductive leg at the two Larmor frequencies will be as far apart as possible on the real axis of the Smith Chart.

Thus, by judiciously tuning the conductive legs 170 they can be rendered sensitive to signals at only one of the two Larmor frequencies being used. Table 2 is a list of possible combinations and the tuning of the stubs.

TABLE 2

Multiple Frequency Coil Table

| | |
|---|---|
| $^3$He/$^1$H Dual Coil | ¼ wave OC stubs for $^3$He and one wave SC stubs for $^1$H |
| $^{13}$C/$^1$H Dual Coil | ¼ wave OC stubs for $^{13}$C and one wave SC stubs for $^1$H |
| $^{23}$Na/$^1$H Dual Coil | ¼ wave OC stubs for $^{23}$Na and one wave SC stubs for $^1$H |

OC = open circuit
SC = short circuit

The multi-nuclear capability of the coil assembly may allow transmitter calibration data for one type of nuclei to be obtained using data obtained simultaneously from another nucleus. Further, the excellent spatial co-registration of the double resonator may allow for navigator schemes whereby the spatial resolution of images of one type of nuclei would be enhanced by navigator signals provided by another type of nuclei. Because the coil assembly provides for simultaneous operation at two different frequencies, the coil assembly inherently allows for shorter scans.

The present invention has been described in terms of one or more preferred embodiments, and it should be appreciated that many equivalents, alternatives, variations, and modifications, aside from those expressly stated, are possible and within the scope of the invention. For example, the electrically matched coaxial cables for various feedlines could be replaced by matched pairs of strip lines. Further, for a coil assembly in a Transmit SENSE parallel imaging scheme, the conjugate pairs need not be disposed on a circular perimeter. Therefore, the invention should not be limited to a particular described embodiment.

The invention claimed is:

1. A coil assembly configured for a magnetic resonance imaging (MRI) system, the coil assembly comprising:
   a resonator having a shield formed around a central axis and having a plurality of pairs of opposing conductive legs arranged symmetrically around the central axis, each conductive leg extending from one end of the shield to another end of the shield; and
   drive circuitry including a plurality of current baluns to drive the plurality of pairs of opposing conductive legs with respect to a floating ground in order to establish substantially equal and opposite current flow in opposing conductive legs.

2. The coil assembly as recited in claim 1, wherein the shield is substantially cylindrical about the central axis.

3. The coil assembly as recited in claim 1, wherein each current balun is driven by a respective quadrature signal.

4. The coil assembly as recited in claim 1, wherein a direct digital synthesizer chip controls the phase and the amplitude of current applied to an input of each current balun.

5. The coil assembly as recited in claim 1, wherein the current baluns are formed as one of a sleeve balun, a coil balun, and a balun having high impedance beads on an outer surface of a coaxial cable.

6. The coil assembly as recited in claim 1 further including a tune and match circuit located between each conductive leg and a respective current balun in order to null a reactive component of an impedance thereat.

7. The coil assembly as recited in claim 6, wherein the tune and match circuit includes a predetermined length of feedline.

8. The coil assembly as recited in claim 7, further including a means for changing a length of the feedline.

9. The coil assembly as recited in claim 6, wherein a tune and match circuit includes a shunt stub matching circuit.

10. The coil assembly as recited in claim 6, wherein a tune and match circuit includes a capacitive L network.

11. The coil assembly as recited in claim 6, wherein a tune and match circuit includes a variable butterfly capacitor.

12. The coil assembly as recited in claim 1, further comprising terminal susceptance elements at least one of capacitors and termination stubs, each terminal susceptance element connected to one end of a respective conductive leg, with the drive circuitry connected to the other end of the respective leg in order to tune each conductive leg to a Larmor frequency.

13. The coil assembly as recited in claim 12, wherein the terminal susceptance elements include coaxial cable termination stubs each having a center conductor connected to its respective conductive leg and having an outer sheath connected to the shield at a first end thereof, and wherein the drive circuitry includes coaxial cables each having a center conductor connected to its respective conductive leg and having an outer sheath connected to the shield at a second end thereof.

14. The coil assembly as recited in claim 13, wherein at least one termination stub is open circuited at an end opposite its shield connected end, and each open circuited stub has a length that combined with a half length of its respective conductive leg is approximately equal to $n\lambda/4$, where $\lambda$ is a wavelength corresponding to a desired Larmor frequency, and n is an odd integer.

15. The coil assembly as recited in claim 13, wherein at least one termination stub is short circuited at an end opposite its shield connected end, and each short circuited stub has a length that combined with a half length of its respective conductive leg is approximately equal to $n\lambda/4$, where $\lambda$ is a wavelength corresponding to the Larmor frequency, and n is an even integer.

16. The coil assembly as recited in claim 1, further comprising terminal susceptance elements including at least one of capacitors and termination stubs and each conductive leg has a terminal susceptance element at each end thereof, and the drive circuitry is connected to the midpoint of each conductive leg.

17. The coil assembly as recited in claim 16, wherein the drive circuitry includes a twin lead cable corresponding to each one of the conductive legs, each conductive leg includes two leg segments to form a conjugate dipole, with one lead of the twin lead cable driving one of the leg segments and the other lead driving the other leg segment, further wherein, for each pair of opposing conductive legs, the leads of the twin lead cable driving one of the conductive legs of the pair are interchanged with respect to the leads of the twin lead cable driving the other of the conductive legs of the pair.

18. The coil assembly as recited in claim 1 wherein at least one pair of opposing conductive legs is tuned to one Larmor frequency and at least one other pair of opposing conductive legs is tuned to a different Larmor frequency.

19. The coil assembly as recited in claim 18 wherein the drive circuitry simultaneously operates with the pairs of opposing conductive legs at their separate respective Larmor frequencies.

20. A coil assembly configured for a multi-nuclear magnetic resonance imaging (MRI) system, the coil assembly comprising:
   a resonator having a shield formed around a central axis and having a plurality of pairs of opposing conductive legs arranged symmetrically around the central axis, each conductive leg extending from one end of the shield to another end of the shield;
   a first tuner configured to tune a first pair of opposing conductive legs to a first Larmor frequency corresponding to a first nucleus;
   a second tuner configured to tune a second pair of opposing conductive legs to a second Larmor frequency corresponding to a second nucleus; and
   at least two current baluns, each current balun connected to a respective pair of opposing conductive legs and being operable to maintain substantially equal and opposite current flow in those opposing conductive legs.

21. The coil assembly as recited in claim 20, in which the drive circuitry simultaneously operates with the pairs of opposing conductive legs at their respective Larmor frequencies.

22. The coil assembly as recited in claim 20, wherein the first and second tuners include termination stubs, each termination stub is connected to one end of a respective conductive leg, and a cable from a respective current balun is connected to the other end of the respective leg.

23. The coil assembly as recited in claim 22, wherein each of the termination stubs for the first tuner has a length that combined with a half length of a respective conductive leg is approximately equal to $n1\lambda 1/4$, where $\lambda 1$ is a wavelength corresponding to the first Larmor frequency, and $n1$ is an odd integer if the termination stub is open circuited, and $n1$ is an even integer if the termination stub is short circuited, and further wherein each of the termination stubs for the second tuner has a length that combined with a half length of a respective conductive leg is approximately equal to $n2\lambda 2/4$, where $\lambda 2$ is a wavelength corresponding to the second Larmor frequency, and $n2$ is an odd integer if the termination stub is open circuited, and $n2$ is an even integer if the termination stub is short circuited.

24. The coil assembly as recited in claim 22, wherein each of the termination stubs for the first tuner are open circuited at a distal end thereof and each has a length that combined with a half length of a respective conductive leg is approximately equal to $n1\lambda 1/4$, where $\lambda 1$ is a wavelength corresponding to the first Larmor frequency and $n1$ is an odd integer, and further wherein each of the termination stubs for the second tuner are short circuited at a distal end thereof and each has a length that combined with a half length of a respective conductive leg is approximately equal to $\lambda 2$, where $\lambda 2$ is a wavelength corresponding to the second Larmor frequency.

25. The coil assembly as recited in claim 20, wherein the first and second tuners include termination stubs, and for each conductive leg, a termination stub is connected at each end, and a cable of a respective current balun is connected to the midpoint of that conductive leg.

26. The coil assembly as recited in claim 25, wherein each of the termination stubs for the first tuner has a length that combined with a half length of a respective conductive leg is approximately equal to $n1\lambda 1/4$, where $\lambda 1$ is a wavelength corresponding to the first Larmor frequency, and $n1$ is an odd integer if the termination stub is open circuited and $n1$ is an even integer if the termination stub is short circuited, and further wherein each of the termination stubs for the second tuner has a length that combined with a half length of its respective conductive leg is approximately equal to $n2\lambda 2/4$, where $\lambda 2$ is a wavelength corresponding to the second Larmor frequency, and $n2$ is an odd integer if the termination stub is open circuited and $n2$ is an even integer if the termination stub is short circuited.

27. The coil assembly as recited in claim 25, wherein each of the termination stubs for the first tuner are open circuited at a distal end thereof and each has a length that combined with a half length of a respective conductive leg is approximately equal to $n1\lambda 1/4$, where $\lambda 1$ is a wavelength corresponding to the first Larmor frequency and $n1$ is an odd integer, and further wherein each of the termination stubs for the second tuner are short circuited at a distal end thereof and each has a length that combined with a half length of a respective conductive leg is approximately equal to $\lambda 2$, where $\lambda 2$ is a wavelength corresponding to the second Larmor frequency.

28. A coil assembly configured for a magnetic resonance imaging (MRI) system, the coil assembly comprising:
   a resonator having a cylindrical shield formed around a central axis and having a plurality of pairs of opposing conductive legs arranged symmetrically around the central axis, each conductive leg extending from one end of the cylindrical shield to another end of the cylindrical shield;
   a tuner configured to tune each conductive leg to a Larmor frequency;
   a current balun connected to each pair of opposing conductive legs and being operable to establish substantially equal and opposite current flow in opposing conductive legs, wherein each current balun is driven by a respective quadrature signal; and
   wherein a direct digital synthesizer chip controls the phase and the amplitude of current applied to an input of each current balun in order to allow for arbitrary adjustment of the three dimensional shape of the resulting B1 magnetic field on transmit in order to provide a transmitter-based parallel imaging scheme.

29. The coil assembly of claim 28, wherein the direct digital synthesizer chip is operable to provide a transmit SENSE parallel imaging scheme.

* * * * *